(12) United States Patent
Pierrat et al.

(10) Patent No.: US 7,155,689 B2
(45) Date of Patent: Dec. 26, 2006

(54) DESIGN-MANUFACTURING INTERFACE VIA A UNIFIED MODEL

(75) Inventors: Christophe Pierrat, Santa Clara, CA (US); Alfred K. Wong, Brookline, MA (US)

(73) Assignee: Magma Design Automation, Inc., Santa Clara, CA (US)

( * ) Notice: Subject to any disclaimer, the term of this patent is extended or adjusted under 35 U.S.C. 154(b) by 267 days.

(21) Appl. No.: 10/680,592

(22) Filed: Oct. 7, 2003

(65) Prior Publication Data
US 2005/0076316 A1 Apr. 7, 2005

(51) Int. Cl.
G06F 17/50 (2006.01)

(52) U.S. Cl. .................... 716/4; 716/5; 716/19

(58) Field of Classification Search .............. None
See application file for complete search history.

(56) References Cited

U.S. PATENT DOCUMENTS

| | | | | |
|---|---|---|---|---|
| 6,904,587 | B1* | 6/2005 | Tsai et al. ............... | 716/19 |
| 2003/0229875 | A1* | 12/2003 | Smith et al. ............ | 716/10 |
| 2004/0121495 | A1* | 6/2004 | Sonderman et al. ...... | 438/14 |
| 2004/0126672 | A1* | 7/2004 | Li ........................ | 430/5 |

OTHER PUBLICATIONS

Smith, Taber H., et al., "A CMP Model Combining Density and Time Dependencies," Proc. CMP-MIC, Santa Clara, CA Feb. 1999 8 pages.

Strolenberg, Chris W., et al., "Stay Away from Minimum Design-Rule Values," ACM SIGDA CD-ROM Project, Mar. 27-30, 2000, 2 pages.

Grobman, W., et al., "Reticle Enhancement Technology: Implications and Challenges for Physical Design," DAC 1001, Jun. 18-22, 2001, Las Vegas, NV, 6 pages.

Gold, Spencer M., et al., "A Quantitative Approach to Nonlinear Process Design Rule Scaling," Proceedings of Advanced Research in VLSI, Mar. 21-24, 1999, pp. 99-112.

Doong, Kelvin Y., et al., "Scaling Variance, Invariance and Prediction of Design Rule: From 0.25-um to 0.10-um Nodes inthe Era of Foundry Manufacturing," IEEE, 2001, 38-42.

Crepeau, J., et al., "Some Results on Yield and Local Design Rule Relaxation," IEEE 1993, 144-151.

Tian, Ruiqi, et al., "Model-Based Dummy Feature Placement for Oxide Chemical-Mechanical Polishing Manufacturability," DAC 2000, Los Angeles, CA 4 pages.

Rieger, Michael L., et al., "Layout Design Methodologies for Sub-Wavelength Manufacturing," DAC 2001, Jun. 18-22, 2001 Las Vegas, NV 4 pages.

Jeppson, Kjell O., et al., "Formal Definitions of Edge-Based Geometric Design Rules," IEEE Transactions on Computer-Aided Design of Integrated Circuits and Systems, 120(1) Jan. 1993, 59-69.

(Continued)

*Primary Examiner*—Leigh M. Garbowski
(74) *Attorney, Agent, or Firm*—Fenwick & West LLP

(57) ABSTRACT

Subtleties of advanced fabrication processes and nano-scale phenomena associated with integrated circuit miniaturization have exposed the insufficiencies of design rules. Such inadequacies have adverse impact on all parts of the integrated circuit creation flow where design rules are used. In addition, segregation of the various layout data modification steps required for deep sub-micrometer manufacturing are resulting in slack and inefficiencies. This invention describes methods to improve integrated circuit creation via the use of a unified model of fabrication processes and circuit elements that can complement or replace design rules. By capturing the interdependence among fabrication processes and circuit elements, the unified model enables efficient layout generation, resulting in better integrated circuits.

55 Claims, 21 Drawing Sheets

OTHER PUBLICATIONS

Tu Wien, "An Introduction to the ASIC Technology and Design Flow," ICT Institute of Computer TEchnology, Feb. 26, 2003, 29 pages.

MOSIS Scalable CMOS (SCMOS) Design Rules (Revision 8.0), MOSIS, Marina Del Rey, CA Apr. 25, 2003, 51 pages.

Frerichs, M.R., "Precise Extraction of Ultra Deep Submicron Interconnect Parasitics with Parameterized 3D-Modeling," Proceedings of the 2001 conference on Asia South Pacific design automation, Yokohama, Japan, 50-56.

Schellenberg, F.M., et al., "Adoption of OPC and the Impact on Design and Layout," DAC 2001, Jun. 18-22, 2001, Las Vegas, NV, 4 pages.

Crepeau, J. et al., "Some Results on Yield and Local Design Rule Relaxation," IEEE 1993, 144-151.

Doong, Kelvin Y. et al., "Scaling Variance, Invariance and Prediction of Design Rule: From 0.25-um to 0.10-um Nodes in the Era of Foundry Manufacturing," IEEE, 2001, 38-42.

Gold, Spencer M. et al., "A Quantitative Approach to Nonlinear Process Design Rule Scaling," Proceedings of Advanced Research in VLSI, Mar. 21-24, 1999, pp. 99-112.

Grobman, W. et al., "Reticle Enhancement Technology: Implications and Challenges for Physical Design," DAC 1001, Jun. 18-22, 2001, Las Vegas, NV, 6 pages.

Jeppson, Kjell O. et al., "Formal Definitions of Edge-Baed Geometric Design Rules," IEEE Transactions on Computer-Aided Design of Integrated Circuits and Systems, 120(1) Jan. 1993, 56-59.

Rieger, Michael L. et al., "Layout Design Methodologies for Sub-Wavelength Manufacturing," DAC 2001, Jun. 18-22, 2001, Las Vegas, NV, 4 pages.

Smith, Taber H. et al., "A CMP Model Combining Density and Time Dependencies," Proc. CMP-MIC, Santa Clara, CA, Feb. 1999, 8 pages.

Strolenberg, Chris W. et al., "Stay Away from Minimum Design-Rule Values," ACM SIGDA CD-ROM Project, Mar. 27-30, 2000, 2 pages.

Tian, Ruiqi et al., "Model-Based Dummy Feature Placement for Oxide Chemical-Mechanical Polishing Manufacturability," DAC 2000, Los Angeles, CA, 4 pages.

Wien, Tu, "An Introduction to the ASIC Technology and Design Flow," ICT Institute of Computer Technology, Feb. 26, 2003, 29 pages.

Chemical Mechanical Polishing (CMP), date unknown, 13 pages.

Woodie, D., Chemical Mechanical Polishing Primer, Cornell Nanfoabrication Facility, date unknown, 14 pages.

Notification of International Search Report and Written Opinion, PCT/US04/33092, Aug. 4, 2006, 7 pages.

* cited by examiner (a) Design aspect (b) Manufacturing aspect

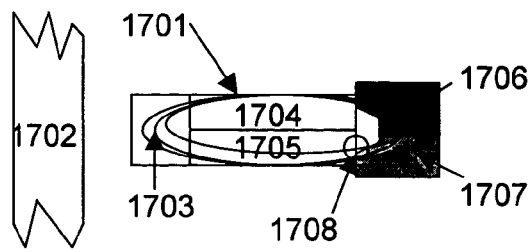 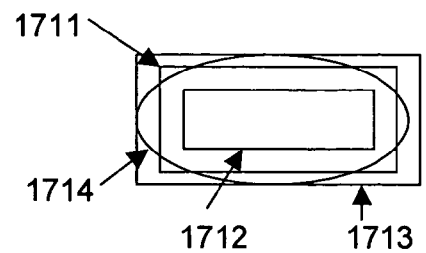
Figure 17a          Figure 17b
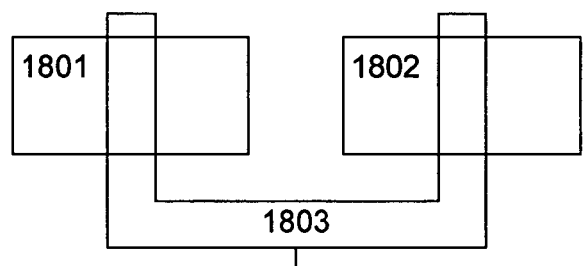
Figure 18a
Decomposition
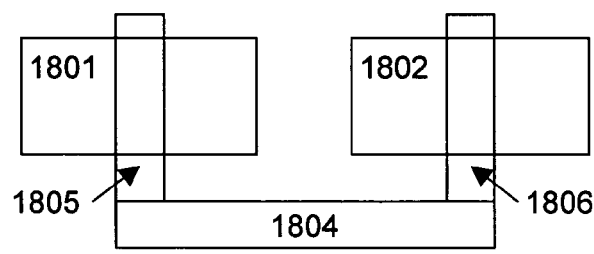
Figure 18b
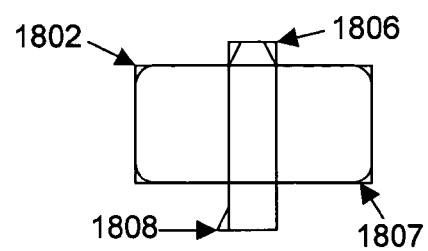
Figure 18c

DESIGN-MANUFACTURING INTERFACE VIA A UNIFIED MODEL

FIELD OF THE INVENTION

This invention relates to the creation of integrated circuits. More specifically, the invention relates to an efficient and efficacious interface between design and manufacturing that improves the quality of information transfer from design to manufacturing and from manufacturing to design. Such improvement enhances the quality of the chips manufactured.

RELATED ART

An integrated circuit (IC) is a piece of hardware that processes data. A representative IC creation flow is depicted in FIG. 1. From a high-level functional description such as speed of operation, footprint, power consumption, and input-output (I/O) of the chip, representation of the IC is refined progressively, with lower-level details being added in each step until the physical IC chip is made.

The flow comprises design and manufacturing as the two primary aspects, which are shown respectively in FIG. 1a and FIG. 1b. Starting from the design aspect illustrated in FIG. 1a, some of the functional description (111) of the IC is first translated into a register transfer level (RTL) description (112). Such translation can be accomplished by design capture, behavioral synthesis, manual programming (not shown in FIG. 1a), or a combination thereof (141). The RTL description typically consists of data control and operation such as addition and multiplication. From the RTL description, logic synthesis (142) implements these controls and operations by a collection of logic gates. These logic gates are sometimes called standard cells. Each standard cell is a collection of a few to a few tens of circuit elements such as transistors, capacitors, inductors, and resistors/conductors; it can perform a logic function such as NAND and NOR, or store a datum value such as a flip-flop. The set of all distinct standard cells for a given IC fabrication technology is a standard cell library (113). Often called a standard cell netlist (114), the standard cell representation of the IC is a collection of standard cells including their interconnectivity information. The netlist is still an abstract representation of the circuit. Physical design (144) translates the abstract representation into a physical representation. Physical design includes many steps such as floor-planning (145), place and route (146), compaction (147), and clock tree synthesis (148). During place and route (146), the collection of standard cells is first tiled to fill a two-dimensional area as densely as possible. The placed standard cells are then connected based on the abstract interconnectivity information. In some applications the placed and routed design undergoes compaction (147) to reduce circuit area. After physical design the IC is represented by a layout (115). A state-of-the-art layout includes a collection of as many as 30 to 40 levels of geometrical description of the IC. Each level comprises one to a few layers of shapes such as squares, rectangles, and polygons.

The design team then tapes out the design and sends the layout to the manufacturing team. The manufacturing aspects of IC creation is illustrated in FIG. 1b. Mask data (116) are derived from the layout by mask data preparation (149). Depending on the type of mask writer (such as raster-scan or vector-scan), mask data preparation can include mask proximity correction and fracturing. Mask data preparation is guided by a model of the mask-making process (181). From the mask data a mast set (117) is made. Mask writing (150) is customarily performed on raster-scan or vector-scan writers. For a state-of-the-art process, a mask set comprises 30 to 40 masks. Each mask in the mask set corresponds to a level in the layout. The images of these masks are replicated successively onto the wafer (118) by lithography, and the wafer is subject to other processing modules such as oxidation, deposition, etching, epitaxy, ion implantation, thermal annealing, and chemical-mechanical polishing (CMP). After cycling the silicon wafer through these processing modules using the different masks in the mask set, the designed circuit elements and their interconnections are fabricated (151). The processed wafers are then diced (152) into dies, and ICs (119) are created.

The transformation applied at each higher-level to lower-level transition in the flow is generally verified. RTL descriptions (112) can be verified by RTL or system-level simulation (171). Logic synthesis (142) can be verified by gate-level simulation or formal verification (172). Physical verification of the layout (115) is also performed. Such verification can include functional correctness and timing, among other performance metrics such as power consumption. Functional correctness can be verified by extracting (173) circuit elements and their electrical connectivity information from the layout, and comparing this information with the netlist (114). This procedure is called layout-versus-schematic (LVS) (174).

Circuit extraction (173) also provides parasitic information on circuit elements. Together with circuit element models (182), this information can be used for verifying that performance (175) of the fabricated circuit such as the operating speed should meet the specifications. Timing verification can be performed using the static timing analysis technique.

The mask set (117) made based on the layout (115) can be inspected by comparing the physical mask shapes with the mask data (116). Mask inspection can be performed by comparing shapes on the mask to the mask data [die-to-database inspection (176)] or by comparing shapes on different dies on the same mask [die-to-die inspection (177)]. Mask features are also measured using metrology tools such as scanning electron microscopes, optical microscope, near-field optical microscopes, scatterometry-based tools, and atomic force microscopes. Features delineated on the wafer are measured to ensure that they are within a specified dimensional tolerance. Wafer metrology (178) can be performed by scanning electron microscopy, scatterometry, atomic force microscopy, or by optical means including near-field optical microscopes. The fabricated chips (119) are finally tested (179) for conformance with the functional specifications (111). Mask data preparation is a step that is seldom verified (In the rare situation of mask data verification, the fractured mask data can be translated to design layout data, which are then compared with the original layout data by Boolean operations such as exclusive or.)

In addition to the various verification steps is a forward confirmation step called design rule check (DRC) (191). (Note that DRC is also used to denote design rule checker, meaning a software program that is used to perform design rule check. In this application, DRC refers to the design rule check process. References to design rule checker are denoted by DRC program or DRC tool.) During DRC, the layout is scrutinized, using a set of design rules (192) that can be specific to the particular technology that the IC will be fabricated with, to ensure that the layout shapes are properly sized and placed such that the fabricated circuit is both manufacturable and electrically functional. By providing a manufacturability check before the layout is committed to manufacturing, DRC reduces IC creation cost by identifying manufacturing problems in the layout before time and resources are spent on making the masks and wafers.

Design rules are mainly geometric rules governing dimensions and spacings between shapes in a layout. They can also include density rules specifying that the coverage of shapes should fall within a prescribed range or area rules, for example, limiting the maximum area of a net.

An example of DRC is shown in FIG. 2. Using a layout (201) representing target wafer shapes or shapes from which target wafer shapes can be derived, a set of design rules (292), and input data and controls (202) provided to the DRC tool, DRC (291) determines whether the layout shapes are properly sized and placed such that the fabricated circuit is both manufacturable and electrically functional. The input data and controls (202) provide information including the specifics of the layout such as the prime (top) cell name, the layout data format, and layer mapping information. The layer mapping information gives a correspondence between the number of a layer and the function of the layer. For example, "layer aa, number 32" means that layer number 32 is the active area layer. The input data and controls can also control the DRC tool, for example, by specifying the particular rules within the design rule set (292) that should be checked. The outcome of DRC is a decision (203) on whether the layout (201) satisfies the design rules that have been verified. DRC may also give output data (204) including shapes that violate design rules, locations of these shapes, and the rules that are violated. These data can be contained in error layers created by DRC, with each error layer describing the violations of a different design rule.

An example DRC process encompasses the steps shown within the DRC rectangle (291) in FIG. 2. The input layout (201) is optionally decomposed (211) to create a decomposed layout (205) that is amenable to the rule checking process. Since most design rules are geometric, DRC is mainly implemented by a series of dimensional check on the shapes and edges in the decomposed layout. Including sizes of shapes, lengths of edges, separations between shapes and edges, overlapping of shapes, intersection of edges, enclosure of shapes within other shapes, and extension of shapes beyond other shapes, these dimensional checks can be implemented by successive and sometimes iterative layer operations (212) on the shapes and edges. Layer operations can construct derived layers (206) from existing layers using, for example, Boolean operators, shapes sizing, or selection rules based on conditions such as length of edges and area of shapes and coincidence of edges.

Besides DRC, design rules are used in other IC creation steps. For example, routing is guided by design rules so that the interconnecting vias and wires are manufacturable. FIG. 3 depicts a high-level view of routing. Necessary ingredients to the routing process (301) include the placed cells with their abstract interconnectivity information (302), input data and controls (303), and design rules (392). Input data and controls can include physical information of the cells such as their sizes, shapes, and pin locations; they can also include the number of interconnect levels of the particular technology that the IC will be fabricated and specifications on the permitted routing regions. Based on the provided information, the routing process converts abstract connections into physical connections between cells, resulting in a routed circuit (304). The routing process (301) can be performed manually or with the assistance of computer-aided design (CAD) technology.

The compaction of a layout also uses design rules. FIG. 4 illustrates a high-level view of compaction. Using design rules (492) and input data and controls (402), the compaction process (403) shrinks an original layout (401) by moving layout shapes and edges within the constraints of design rules (492). The resulting compacted layout (404) generally occupies less area than the original layout (401). Compaction (403) can be performed manually or with the assistance of CAD technology.

While some functions of an IC can be created by the flow, as shown in FIG. 1, that involves RTL description (112) and standard cell netlist (114), other functions can be realized in different manners. For example, a portion of the IC can be designed (153) by expressing parts of the functional description (111) as a transistor schematic (120). This schematic can be verified with respect to the specifications by simulation (180). Both design (153) and simulation (180) may use models of circuit elements (182) such as SPICE models. Physical design can be accomplished by manual layout editing rather than standard cell synthesis and place and route.

Although variations to the IC creation flow depicted in FIG. 1 exist for different practices and for different components within an IC (such as digital, analog, mixed-signal, datapath, control logic, memory, custom, IP blocks, gate arrays, and input-output circuitry), the principles are similar. The IC creation flow comprises a series of transformations, each translating the circuit to a lower-level description until the physical chips are fabricated. Most of these transformations are verified. The design-manufacturing interface is implemented by a set of design rules. Such rules are used whenever circuit designers need to work with layouts.

FIG. 5 encapsulates the existing IC creation process. IC creation is divided into design (501) and manufacturing (502) aspects. Based on circuit element models (503) and design rules (592) provided by circuit manufacturers, circuit designers generate the layout (504) of the IC. Such layout generation can be facilitated by the use of CAD technology (505). From the layout, circuit manufacturers fabricate the ICs (506). The circuit element models (503) can be derived from a variety of means including manufacturing data, empirical fitting, theoretical considerations, and computer simulation such as technology computer-aided design (TCAD) programs.

Although not ICs, standard cells can be created based on similar principles. An example standard cell creation process is depicted in FIG. 6. From the functional description (601), a standard cell is first designed (621) by specifying the circuit elements needed and their interconnection. This netlist (602) is then verified by schematic or circuit simulation (641) to ensure that performance goals are met. Using design rules (692) as constraints, translation of the netlist into a layout (603), i.e., physical design (622), can be accomplished by CAD synthesis, manual drawing, or a combination thereof. The layout (603) then undergoes extraction (623). Circuit extraction uses the layout to derive circuit elements and their electrical connectivity, as well as parasitic information on circuit elements for physical verification. Functional verification can be accomplished by LVS (642). Manufacturability verification can be performed by DRC (691) using design rules (692). The extracted information is also used for characterization (624) of the standard cell. Such characterization may include input capacitance of the standard cell, pin-to-pin propagation delays, power dissipation, and setup and hold time for sequential elements. The characterized data are turned into a model of the standard cell (604). The standard cell model (604) together with the layout (603) forms the standard cell (605), which can be used in various steps in the IC creation flow including synthesis, and place and route.

The use of design rules in IC creation and its related areas such as standard cell generation increases efficiency of the IC creation process by allowing for specialization and independent optimization, which in turn translates to reduced cost. The use of design rules neatly divides the design and manufacturing aspects of IC creation. A design rule set is a contract between circuit designers and circuit manufacturers. By providing circuit manufacturers a layout conforming to design rules, circuit designers are assured that the circuit will be fabricated properly. With design rules as the link between circuit designers and manufacturers, designers have no need to worry about manufacturing processes as long as the layout is design-rule-compliant. Conversely, manufacturers do not need to trouble themselves with understanding designs; they can concentrate on replicating geometric shapes onto silicon wafers. By encapsulating manufacturability and electrical correctness information of a fabrication technology, design rules enable designers and manufacturers to work independently in their respective domains without the complication of needing to understand the details of the other aspect. This specialization has contributed to the exponential improvement in IC performance over the last few decades. It has also made semiconductor foundries viable.

Besides design rules, advances in IC fabrication technology also contribute to the exponential improvement in IC performance. The smallest feature, also called critical dimension (CD), that can be defined on a silicon wafer has been decreasing by 30% every two to three years over the last few decades. CD of the most advanced production process was 500 nm in 1990, 350 nm in 1995, 250 nm in 1997, 180 nm in 1999, and 130 nm in 2001. It is projected to be 90 nm in 2004.

The CD miniaturization trend increasingly challenges the semiconductor industry. The demands include managing design complexity, coping with non-linear effects in fabrication, and contending with nano-scale phenomena.

IC fabrication is increasingly strained with decreasing CDs from one technology generation to the next. One example is the optical lithography module. The CD is customarily expressed in terms of photolithography parameters as $$CD = k_1 \frac{\lambda}{NA},$$

where
  $\lambda$ is the wavelength of light used to expose the mask,
  NA is the numerical aperture of the exposure system, and
  $k_1$ is the lithography-process-related factor measuring the ease of lithography.

The smaller CDs from one generation to another are enabled by using light with shorter wavelength, increasing NA, decreasing $k_1$, or some combination of the above.

In particular, the $k_1$ factor has been decreasing throughout the years, dropping below 0.5 in the last few years. One artifact of optical lithography at this low $k_1$ value is image distortion. The geometrical shapes on masks are not reproduced properly onto the wafer. Examples of image distortion include proximity effect (features with the same nominal dimension in the layout printing differently onto the wafer), nonlinearity (changes in nominal layout sizes not reflected linearly in wafer CDs), shortening (length of a printed feature being less than the nominal length in layout), and corner rounding (rounding of corners of polygons in layout after imaging).

One method for compensating for image distortions is to take into consideration the amount of distortion expected in the fabrication process and pre-distort layout patterns such that the fabricated circuit patterns resemble the desired shapes as much as possible. The pre-distortion can account for distortions in the lithography process including proximity effects, flare, and exposure-system-specific aberration variations. It can also account for processing steps other than lithography such as etching. Examples of pre-distortion include selective feature biasing (increasing or decreasing the sizes of layout shapes), assist features insertion (adding auxiliary features to the periphery of main features to improve lithography process latitude), feature lengthening, hammer heads, and serifs. The technique of applying pre-distortion to the layout to compensate for processing artifacts is commonly called optical proximity correction (OPC). OPC-specific design rules are sometimes defined, especially for assist features insertion, to accommodate for these pre-distortions.

A representative high-level view of OPC is illustrated in FIG. 7. OPC (701) is applied to an original layout (702) representing target wafer shapes or shapes from which target wafer shapes can be derived. The correction is performed using a distortion behavior of the fabrication process (703) that can include modules such as lithography, etching, and mask-making, and input data and controls (704). The distortion behavior can be a physical, heuristic, or empirical model of the fabrication processes; it can also be a set of rules that encapsulates patterning distortions. The input data and controls can include specifications on how the original layout should be dissected, the portions of the layout that should be corrected, and the aggressiveness of the corrections. The result of OPC is a corrected layout (705) with pre-distortions that compensate for processing artifacts.

Using phase-shifting masks (PSMs) can also improve low-$k_1$ photolithography. These PSMs contain at least two different regions. Each region corresponds to a different phase and amplitude of light either transmitting through the region (for transparent masks) or reflected by the region (for reflective masks). The phase difference between the two regions is chosen to be substantially equal to 180° or 180° plus integer multiples of 360°. This phase difference causes destructive interference, thus creating sharp images between the regions. The improved image quality enables the printing of smaller features on the wafer. Two main classes of PSMs are in use today. For the first class, the amount of light transmitted (for transparent masks) or reflected (for reflective masks) by one region is only a portion, typically 5% to 15%, of the light transmitted (or reflected) by the other region. These masks are commonly called attenuated phase-shifting masks or half-tone phase-shifting masks. For the second class of PSMs, the amplitude of light transmitted (for transparent masks) or reflected (for reflective masks) by one region is substantially equal to the light transmitted (for transparent masks) or reflected (for reflective masks) by the other region. This second class of masks includes alternating phase-shifting masks, chromeless phase-shifting masks, rim phase-shifting masks, and tri-tone masks. Practical implementation of PSMs is improved with the use of OPC including selective feature biasing, assist features insertion, feature lengthening, hammer heads, and serifs as described in [0023].

Even though resolution enhancement afforded by the second class of PSMs has been extensively demonstrated, their implementation hinges upon CAD technology that is aware of phase-shifting-specific layout constraints. The exact requirements may depend on the particular PSM implementation such as mask tone (light-field or dark-field) and the possible need for residual phase edge removal (methods include trim masks and multi-phase transitions). These constraints can sometimes cause a non-local geometrical chain reaction. CAD technology is needed to address these requirements in areas such as layout editing, synthesis, place and route, and phase-shifting conversion for phase regions insertion and assignment.

As an example of CAD technology for PSM implementation, FIG. 8 illustrates a phase-shifting conversion process. Phase-shifting conversion (801) is applied to an incoming layout (802) taking into consideration input data and controls (804), and phase-shifting constraints and requirements (803). The input data and controls can include the particular PSM implementation and the portions of the layout that should be corrected. The constraints and requirements can include the minimum size of a phase region and layout configurations that cannot be properly converted. Design rules (892) can be used in conjunction with or in place of these constraints and requirements. The result of phase-shifting conversion is a phase-shifted layout (805) that is amenable to PSM implementation. This phase-shifted layout (805) usually undergoes OPC subsequently for performance improvement and silicon-versus-layout (SiVL) (to be discussed in [0035]) for verification.

Details of phase-shifting conversion (801) are shown in the rectangular box in FIG. 8. Phases are assigned (806) to shapes defined in the input layout (in dark-field applications for example) or shapes derived from the input layout (in light-field applications for example) to create a phase-shifted layout (807). The phase-shifted layout is then checked for existence of phase conflicts. Absence of conflicts indicates that the phase-shifted layout is amenable to PSM implementation. Presence of conflicts necessitates conflict resolution (808), which attempts to resolve phase conflicts within the confines of the existing layout configuration. Success of conflict resolution indicates that the phase-shifted layout is amenable to PSM implementation. Otherwise, the existing phase-shifted layout is modified (809) to create another phase-shifted layout. The iteration continues until a layout amenable to PSM implementation results.

OPC and PSM belong to a category of lithography methods called resolution enhancement techniques (RETs) that also include modified illumination and pupil filtering. Some of these techniques can be used together to enhance lithography performance. For example, the use of off-axis illumination, a form of modified illumination, can be combined with assist feature OPC to improve imaging of sparse features. Application of RETs improves resolution of photolithography. But the use of these techniques can necessitate so much layout modification that the modified layout has little resemblance to target wafer shapes.

In addition to low-$k_1$ imaging artifacts, decrease in focus tolerance is another issue for optical lithography. Also called depth-of-focus (DoF), the amount of allowable focus variation in a photolithography process is proportional to $$DoF \propto \frac{\lambda}{4NA^2}(1 + \sqrt{1 - NA^2})$$

Since shorter wavelengths and higher numerical aperture values are used for manufacturing smaller CDs, DoF is shrinking rapidly. Sources of focus variation such as exposure system focal plane deviation, focus setting error, wafer and mask flatness, and wafer topography must be minimized.

Material film deposition onto the wafer is a cause of wafer topography because the deposition process substantially replicates topography of the underlying surface. The underlying topography can result from structure of circuit elements or from interconnecting metal wires. Left unattended, wafer topography can cause difficulties for photolithography because of DoF issues. It may also increase wiring resistivity because of thickness variation on metal levels.

Chemical-mechanical polishing (CMP) is an effective method for wafer planarization. During the CMP process, however, only the highest features on the wafer touch the polishing pads. Pressure is thus increased at these contact points. This increased pressure translates to polishing rate increase, causing non-uniformity in the removal rate across patterns of different pattern densities. A method to balance the polishing rates between dense and sparse regions in designs is to create dummy fill patterns around sparse regions to match the higher pattern density of dense regions.

A representative high-level view of dummy fill insertion is illustrated in FIG. 9. Dummy fill insertion (901) is applied to an original layout (902) based on input data and controls (904) and a topography behavior (903). The topography behavior can be a physical, heuristic, or empirical model of the CMP process that computes the expected wafer topography for different layout levels; it can also be a set of rules that encapsulates the relationship between layout pattern density and topography. The input data and controls can include specifications on how the layout should be filled and the portions of the layout that should be filled. Dummy fill insertion is also guided by design rules (992) so that the dummy patterns are compliant with manufacturability and electrical constraints. The result of dummy fill insertion is a filled layout (905) with dummy fill patterns that can reduce wafer topography variations.

Techniques for improving manufacturability such as OPC, PSM, and dummy fill pattern insertion described above necessitate modification and manipulation of layout data. Data flow from layout to mask data becomes more complex compared with that depicted in FIG. 1, and it is summarized in FIG. 10. The original layout (1001) [labeled (115) in FIG. 1], representing target wafer shapes or shapes from which target wafer shapes can be derived, is modified by a series of steps such as dummy fill insertion (1011), phase-shifting conversion (1012), and OPC (1013). Some of these steps require decomposition of the original layout into a decomposed layout that is amenable to layout modification. These layout modification steps are guided by behaviors of the fabrication and mask-making (data preparation) processes. For example, a topography behavior (1021) guides insertion of dummy fill patterns; phase-shifting constraints and requirements (1022) guide phase assignment; and a distortion behavior (1023) guides OPC. Some of these layout modification steps are also guided by design rules (1092). The result of these layout modification steps is a modified layout (1002). While not all the steps illustrated in FIG. 10 are necessarily applied in all circumstances and the ordering of the modification steps in the flow may differ, changes to the layout are applied prior to mask data preparation (1014).

The modified layout should be verified with respect to the original layout. Such verification can be accomplished by silicon-versus-layout (SiVL) (also called optical rule check) (1031), which models the expected delineation of the modified layout onto a wafer, and compares this expected delineation with the target wafer shapes to ensure that the applied layout modifications are valid.

The layout modification steps illustrated in FIG. 10 generally add many shapes to the layout data, thereby increasing data volume and mask cost. Some of the added shapes may affect mask manufacturability and yield. It is thus desirable, when a mask anomaly is found during the mask inspection process, to determine the effects of such a potential defect before deciding whether or not to repair the anomaly. An approach to aid such decision is the virtual stepper technique, which simulates the photolithography impact of the anomaly to determine whether or not the anomaly will cause an out of specification situation during fabrication. Although the virtual stepper technique evaluates the lithography impact of mask anomalies, it cannot assess their electrical impact.

The IC creation flow illustrated in FIG. 1 and FIG. 10 is becoming inadequate with CD miniaturization. Design rules represents a notable area. Associated with increasing manufacturing complexity is a drastic increase in the number of design rules for each technology. Such dramatic increase is caused in part by the increasing range of processing effects compared with the CD. For example, the millimeter range of CMP processes is a few orders of magnitude larger than the CD; the optical interaction range in photolithography is about 5 times the CD at low-$k_1$ imaging situations. The increasing ratio of the range of processing effects to the CD means that many shapes and edges should be taken into consideration in applying a design rule, implying the necessity of numerous rules to cover all conceivable layout configurations. Definition, maintenance, and verification of design rules have become a time-consuming, resource-intensive, and error-prone process. Design rules within the same rule set can also be contradictory. Moreover, design rules inherently lack satisfactory two-dimensional descriptions. The large number of design rules is thus still insufficient in capturing all subtleties of advanced fabrication processes and nano-scale phenomena. Some of these effects can be non-linear such as patterning distortion, and some can be non-local such as phase-shifting conversion. Similar difficulties with rules have been encountered in OPC, where the industry has witnessed a switch from rule-based to model-based OPC implementations.

To cope with the subtleties of advanced fabrication processes, preferred design rules have been devised aiming at improving manufacturability. But these rules are generally relaxed compared with the normal rule set such that implementation of these preferred design rules diminishes performance, for example, by reducing circuit density, and decreases silicon efficiency.

Moreover, there is a discrepancy in fineness of control between design rules and layout modification such as OPC. By capturing manufacturability and electrical correctness by a few parameters, design rules (for example, normal rules such as dimensions of shapes and preferred rules such as a discouraged or forbidden range of separation between shapes) are coarse. On the other hand, OPC, especially model-based OPC, works on improving the fine details of shapes. Such discrepancy means that the fineness gained by one can be lost by the coarseness of the other.

Another issue with design rules concerns design rule migration. Design rules for a particular technology generation are typically scaled from a previous generation with certain modifications. Since the fabrication processes are generally not in place during initial design rules definition, the design rules can only be determined based on extrapolation of existing empirical data and simulation prediction. A low-quality design rule may be incorporated during this initial definition phase and results in layouts that have inferior manufacturability.

Moreover, design rules for a particular technology generation are generally fixed at the beginning of the generation, regardless of subsequent changes in the fabrication processes. They need to be fixed at such an early stage because the time it takes to design a circuit, to develop mature processes, and to establish design rules make the IC creation process rather rigid. Design rules once established are very difficult to change. Using these fixed design rules, circuit designers cannot take advantage of possible improvements afforded by later process changes.

Becoming more apparent with advances in semiconductor technology, design rule inadequacies are resulting in slack and inefficiencies in the IC creation process. Design rules is becoming a limiting factor in the IC creation flow. Since DRC is the sole verification for manufacturability and electrical correctness of a design layout, the quality of the verification is only as good as the quality of the design rules. In addition to affecting DRC and confidence in the manufacturability of layouts, design rule inadequacies also have ramifications on all parts of the IC creation flow where design rules are used.

As an illustration of design rule slack, consider the routing situation shown in FIG. 11a. In this example, a connection between the two vias (1101) and (1102) is needed in a layout configuration comprising four vias (1101), (1102), (1103), and (1104). These vias are customarily drawn as squares in layouts. The layout configuration does not allow a direct connection because the spacing d (1105) between the intervening vias (1103) and (1104) is less than s (1106), the minimum separation specified by design rules. The connection (1107) can be made by routing around either via (1103) or via (1104).

The shapes of the vias, although drawn as squares in the layout, are substantially circular after fabrication, as shown by shapes (1111), (1112), (1113), and (1114) in FIG. 11b. Rounding of the vias (1113) and (1114) results in a larger spacing d' (1115) between them. This separation is larger than s (1106), permitting a direct connection (1117) between vias (1111) and (1112). A router that uses the drawn square shapes and constrained by the design rule [s (1106)] would not be able to make this direction connection, a route that decreases wire length and potentially reduces circuit area.

Shape distortion arising from the fabrication process can also affect circuit extraction. Since the delineated shapes on the wafer are different from the layout shapes, circuit information extracted from the layout shapes such as parasitic capacitance, inductance, and resistance can be insufficient for performance verification.

Another area that is becoming inadequate in the existing IC creation flow concerns application of layout modifications, a process illustrated in FIG. 10. Layout data are modified without knowledge of circuit function and criticality. Shapes whose exact delineations are non-critical to circuit operations are often modified with the same rigor as shapes that are critical. Using auxiliary layout layers to identify areas of differing criticality has been practiced. But such practice requires explicit creation of these auxiliary layers.

Segregation is another drawback of the data modification steps. Dummy fill pattern insertion, phase-shifting conversion, and OPC are applied separately, and often by different engineers. Such segregation can result in superfluous data modification. For example, OPC may be applied to dummy fill patterns.

SUMMARY

The present invention provides methods to improve integrated circuit creation via the use of a unified model that can complement or replace design rules. Because the unified model includes parametric representations of different fabrication processes and circuit elements, the physical and electrical descriptions can be determined by taking into consideration the interdependence among different processing steps and circuit elements, giving the descriptions improved accuracy. The unified model can also take into consideration propagation of manufacturing errors from level to level. In one embodiment of the invention, the unified model is used to compute a layout description for a given layout of material in an integrated circuit taking into account other patterned layers of material. The model comprises at least two parametric representations, one characterizing the layer of material being described and the other representation characterizing another patterned layer of material. The layout description is computed using at least these two representations.

In some embodiments, the computation is performed by including the effects of placement fluctuations, process variations, or a combination of both. The computation can include decomposition of the layout, or modification of the layout, or identification of a circuit element with the layout. Identification of a circuit element can be based on a physical description computed by the model. In other embodiments, the model is based on physical theory, approximations, heuristics, or any combination thereof. In yet other embodiments, the layout description is a physical description, an electrical description, or a combination of both. In yet other embodiments, the parametric representation is one of the following: a lithography process, a mask-making process, an oxidation process, a deposition process, an etching process, an epitaxy process, an ion implantation process, a thermal process, a chemical-mechanical polishing process, a transistor, a capacitor, an inductor, or a resistor.

The unified model can also be used to verify a target patterned layer of material of an integrated circuit made of multiple patterned layers. A description of the target patterned layer taking into account at least another patterned layer can be computed using a model that includes at least a first parametric representation characterizing features of the target patterned layer, and a second parametric representation characterizing features of another patterned layer different from the target patterned layer. The verification is performed by comparing the resulting description to a target description of the layout used to generate the patterned layer of material. The computation of the description can include determining effects due to placement fluctuations, process variations, or a combination of both. The description can also be checked against a design rule defined by the manufacturing and electrical requirements of the integrated circuit.

The model can be based on physical theory, approximations, heuristics, or any combination thereof. The parametric representations can be one of the following parametric representations: a lithography process, a mask-making process, an oxidation process, a deposition process, an etching process, an epitaxy process, an ion implantation process, a thermal process, a chemical-mechanical polishing process, a transistor, a capacitor, an inductor, or a resistor. The description can be obtained by modifying the layout and then computing the description using the modified layout. The modification of the layout can include one of the following: dummy fill insertion, phase-shifting conversion, optical proximity correction, or any combination thereof. Computing the description can also be achieved by identifying a circuit element of the layout and obtaining a description from this circuit element. To identify the circuit element, the layout can be decomposed and the circuit element can be recognized from the decomposed geometries. The comparison of the representations can be achieved using a tolerance. A parameter of the model or a value derived from a parameter of the model can be part of the tolerance. A tolerance region can also be defined by decomposing the layout to obtain a decomposed geometry that can be a point or a shape, and associating the tolerance region to the decomposed geometry. The tolerance can also include a tolerance surface. When a tolerance is used, the comparison between the descriptions can include computing a difference between the descriptions and comparing the difference with the tolerance. The tolerance can also be determined using an electrical description obtained by identifying a circuit element within the layout and obtaining the electrical description of the circuit element. Both descriptions can include manufacturing and electrical specifications from one of the following: modulation transfer function, contrast, exposure latitude, image log slope, normalized image log slope, depth of focus, exposure-defocus window, total window, sensitivity to mask critical dimension error, sensitivity to aberrations, common window, linewidth variability, threshold voltage, leakage current, breakdown electric field, channel-length-modulation parameter, input and output impedance, input and output capacitance, input and output inductance, current density, current gain, unity current gain frequency, or any combination thereof.

In another embodiment of the invention, a method for identifying weak spots in a target patterned layer of material in an integrated circuit including a plurality of patterned layers of material is described. A model is used that includes at least a first parametric representation characterizing features of the target patterned layer, and a second parametric representation characterizing features of one of the plurality of patterned layers other than the target patterned layer. Using two different values of a parameter of the model, two descriptions of the layout corresponding to the patterned layer can be obtained using the model. Finally the two descriptions are compared. The comparison of the description could include the use of design rules defined by the manufacturing and electrical requirements of the integrated circuit. Another method to identify weak spots would be to verify each description and to compare the verification results. The comparison of the verification results could also use design rules.

In another embodiment of the invention, a method for defining a physical connection in a target patterned layer of material in an integrated circuit including a plurality of patterned layers of material is described. A model is used that includes at least a first parametric representation characterizing features of the target patterned layer, and a second parametric representation characterizing features of one of the plurality of patterned layers other than the target patterned layer. The physical connection is created by providing a collection of placed cells with abstract interconnectivity information and by creating a physical connection with the help of a description of the layout using the model. Design rules can also be used in conjunction with the model.

In another embodiment of the invention, a method for compacting a layout of a target patterned layer of material in an integrated circuit including a plurality of patterned layers of material is described. A model is used that includes at least a first parametric representation characterizing features of the target patterned layer, and a second parametric representation characterizing features of one of the plurality of patterned layers other than the target patterned layer. The compaction of the layout includes the step of computing a description of the layout using the model. The compaction could also include checking against design rules in combination with the model.

In another embodiment of the invention, a method for layout synthesis of a layout of a target patterned layer of material in an integrated circuit including a plurality of patterned layers of material is described. A model is used that includes at least a first parametric representation characterizing features of the target patterned layer, and a second parametric representation characterizing features of one of the plurality of patterned layers other than the target patterned layer. The layout synthesis includes the steps of providing a netlist and computing a layout using the netlist and a description of the layout using the model. The synthesized layout can also be checked against design rules.

In another embodiment of the invention, a method for generating a design rule used in the generation of a layout of a target patterned layer of material in an integrated circuit including a plurality of patterned layers of material is described. A model is used that includes at least a first parametric representation characterizing features of the target patterned layer, and a second parametric representation characterizing features of one of the plurality of patterned layers other than the target patterned layer. The design rule generation includes the steps of providing a specification of the target patterned layer, providing a parameter of the model, and generating the design rules using the model, the parameter, and the specification. The model is used in the computation of a description of a layout.

In another embodiment of the invention, another method for generating a design rule used in the generation of a layout of a target patterned layer of material in an integrated circuit including a plurality of patterned layers of material is described. A model is used that includes at least a first parametric representation characterizing features of the target patterned layer, and a second parametric representation characterizing features of one of the plurality of patterned layers other than the target patterned layer. The design rule generation includes the steps of providing a template of a design rule, providing a specification of the template, and generating a design rule using the model and the specification. The model is used in the computation of a description of a layout.

In another embodiment of the invention, a method for extracting an electrical parameter of a layout of a target patterned layer of material in an integrated circuit including a plurality of patterned layers of material is described. A model is used that includes at least a first parametric representation characterizing features of the target patterned layer, and a second parametric representation characterizing features of one of the plurality of patterned layers other than the target patterned layer. The extraction method includes the steps of computing a description using the model, and computing the electrical parameter using the description. The electrical parameter can be the parasitic capacitance, the parasitic inductance, or the parasitic resistance.

In another embodiment of the invention, a method for layout editing of a layout of a target patterned layer of material in an integrated circuit including a plurality of patterned layers of material is described. A model is used that includes at least a first parametric representation characterizing features of the target patterned layer, and a second parametric representation characterizing features of one of the plurality of patterned layers other than the target patterned layer. The layout editing includes the steps of providing a shape of the layout being drawn, computing a target description of a portion of the layout including the shape using the target patterned layer of material, computing another description of a portion of the layout including the shape using the model, comparing the two descriptions and supplying feedback to the user. The description generated using the model can be checked against design rules. The feedback could include one of the following: a suggestion of vertex location, a region of allowable vertex locations, a list of suggestions, a ranking, or any combination thereof. The feedback could also include an explanation including one of the following: a reason for a suggested location, a reason for a discouraged location, a reason for a disallowed location, or any combination thereof.

In another embodiment of the invention, a method for modifying a layout of a target patterned layer of material in an integrated circuit including a plurality of patterned layers of material is described. A model is used that includes at least a first parametric representation characterizing features of the target patterned layer, and a second parametric representation characterizing features of one of the plurality of patterned layers other than the target patterned layer. The method of modifying the layout includes the steps of computing a modified layout from a portion of the layout using the model. The model can be based on one of the following: physical theory, approximation, heuristics, or any combination thereof. The parametric representation can be one of the following: a lithography process, a mask-making process, an oxidation process, a deposition process, an etching process, an epitaxy process, an ion implantation process, a thermal process, a chemical-mechanical polishing process, a transistor, a capacitor, an inductor, or a resistor. The description can be an electrical description. The modification can be one of the following: OPC, phase-shifting conversion, mask data preparation, dummy fill insertion, or a combination thereof.

In another embodiment of the invention, a method for disposing of an anomaly of a mask fabricated using a layout of a target patterned layer of material in an integrated circuit including a plurality of patterned layers of material is described. A model is used that includes at least a first parametric representation characterizing features of the target patterned layer, and a second parametric representation characterizing features of one of the plurality of patterned layers other than the target patterned layer. The method for disposing of the anomaly of a mask includes the following steps: extracting a portion of the layout corresponding to the mask anomaly, computing a description of the portion of the layout using the model, and evaluating whether to repair said mask anomaly based on said description. The evaluation can also include checking against design rules.

In another embodiment of the invention, a method for manufacturing an integrated circuit including a plurality of patterned layers of material is described. A model is used that includes at least a first parametric representation characterizing features of the target patterned layer, and a second parametric representation characterizing features of one of the plurality of patterned layers other than the target patterned layer. The method comprises: obtaining a computer readable layout of a portion of the target patterned layer of material, performing an operation on the layout to create an output layout using a data processor and using the model, producing mask data using the output layout, producing a mask having a mask layout patterned based on the mask data, and producing the target patterned layer of material. The operation can include one of the following: layout editing, layout synthesis, routing, compaction, layout verification, layout modification, or obtaining a layout description.

BRIEF DESCRIPTION OF THE FIGURES

FIGS. 17a and 17b illustrate a manufacturing check using decomposed shapes.

FIGS. 18a–18c illustrate an electrical check.

DETAILED DESCRIPTION

Figure 1A:
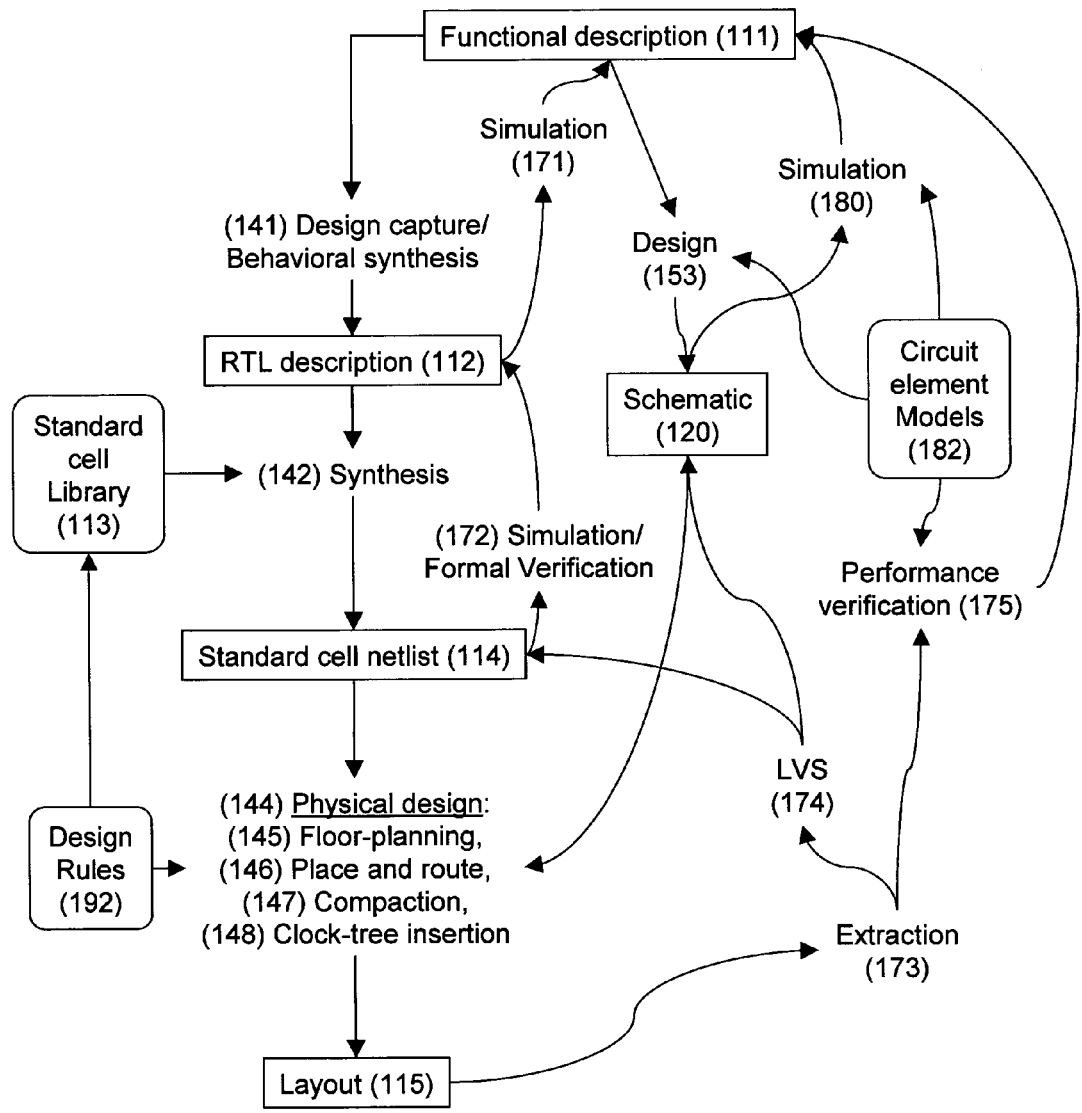
FIGS. 1a and 1b show a representative IC creation flow.
Figure 1B:
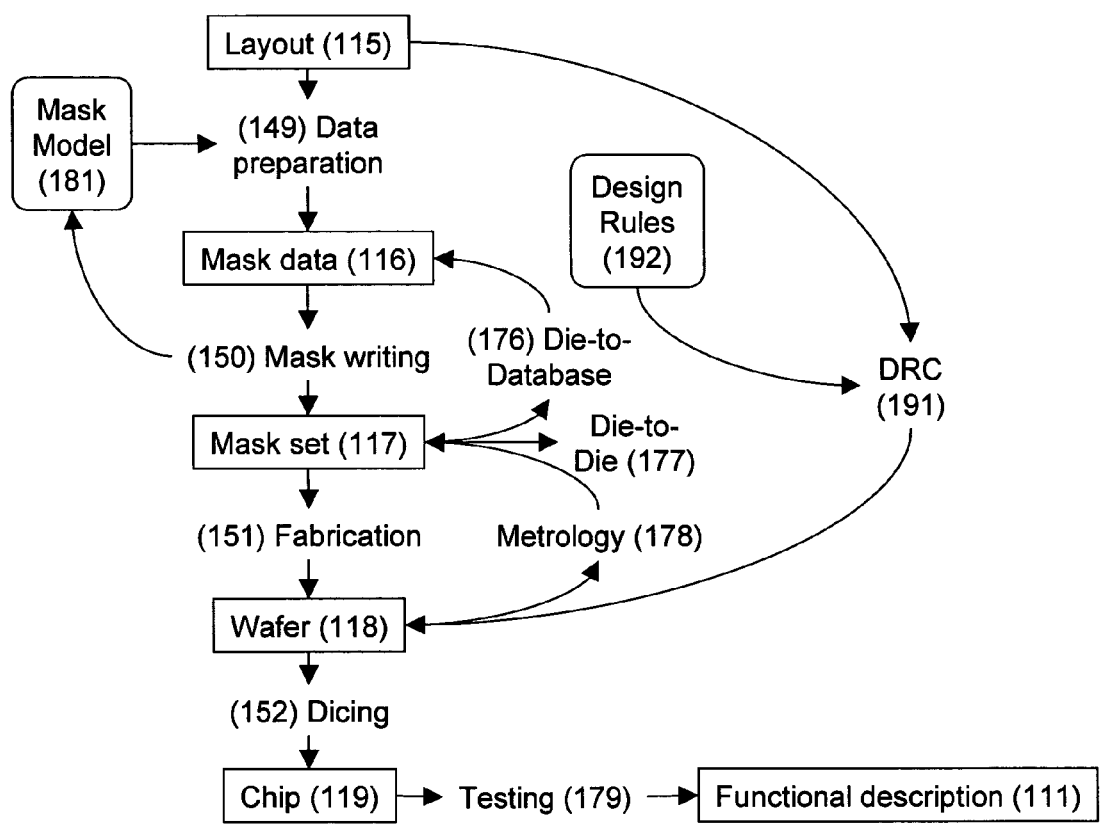
Figure 2:
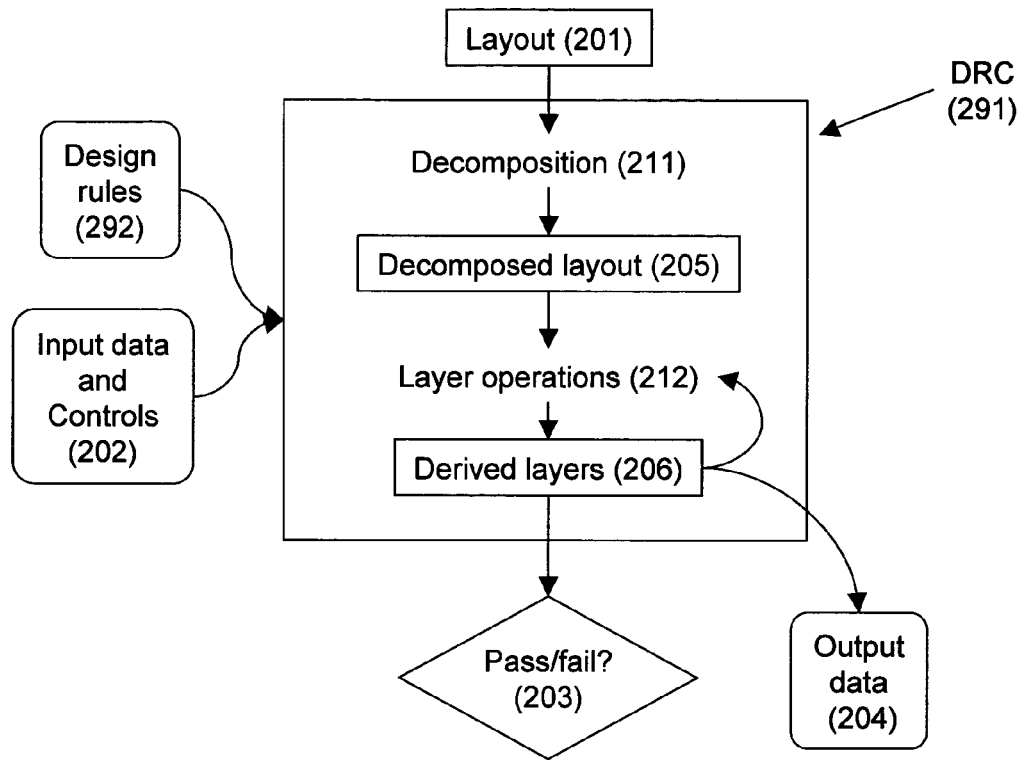
FIG. 2 illustrates a DRC process.
Figure 12:
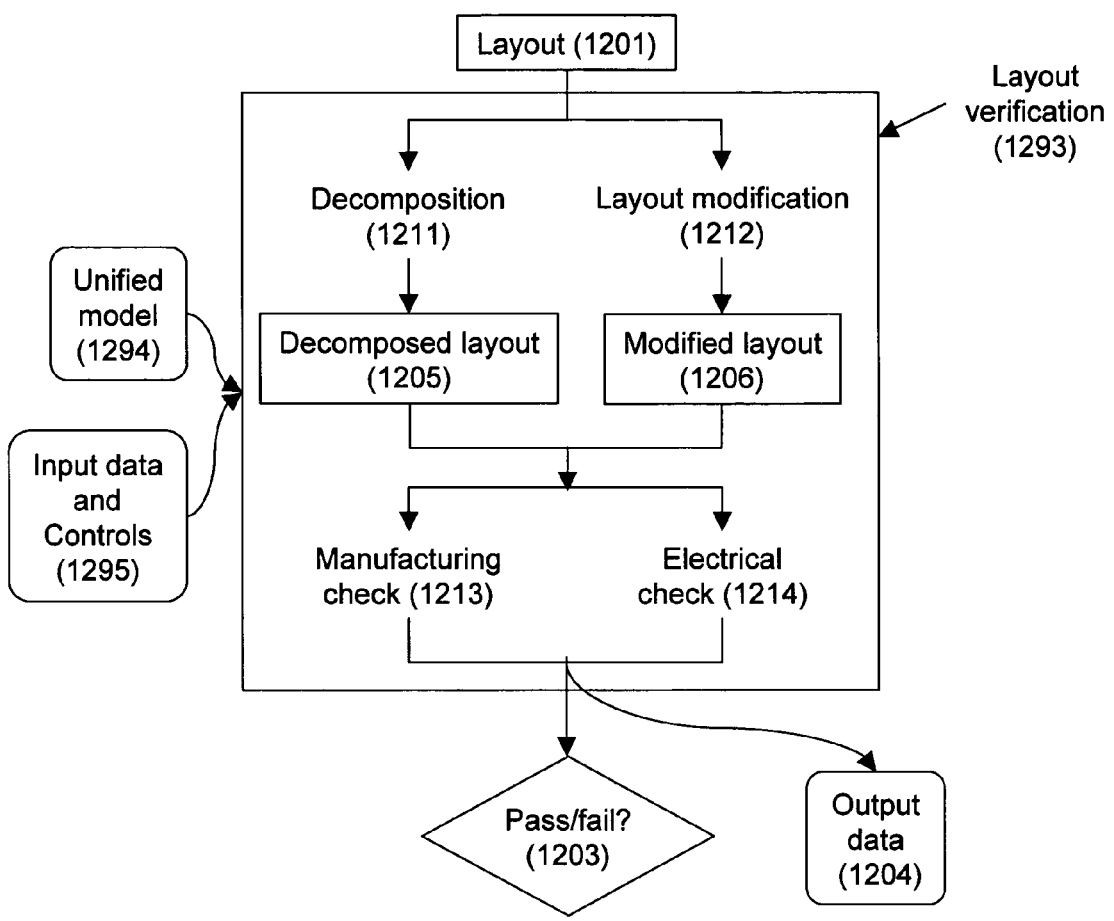
FIG. 12 illustrates the layout verification process.

To address the issues with existing design rules and to maintain the advantage of design-manufacturing division, the layout verification process shown in FIG. 12 has been developed to complement or to replace the existing DRC process shown in FIG. 2. Given a layout (1201) representing target wafer shapes or shapes from which target wafer shapes can be derived, a unified model of manufacturing processes and circuit elements (1294), and input data and controls (1295), layout verification (1293) determines whether the layout shapes are properly sized and placed such that the circuit eventually fabricated is both manufacturable and electrically functional. The input data and controls (1295) can provide the layout verification process (1293) with information including the specifics of the layout such as the prime cell name, the layout data format, and the layer mapping information. They can also control layout verification (1293), for example, by specifying the layout levels to be verified and the types of check. The outcome of layout verification is a decision (1203) on whether the layout (1201) satisfies the checks that have been performed. In addition, layout verification may also give output data (1204) including shapes that fail certain checks, locations of these shapes, and the reasons for the failures. The output data can also include a score representing how well the layout shapes are sized and placed.

More details of layout verification are shown within the layout verification rectangle (1293) in FIG. 12. The input layout (1201) is optionally decomposed (1211) to create a decomposed layout (1205) that is amenable to layout verification. If needed, the input layout (1201) can also be modified (1212) for techniques such as OPC, phase-shifting conversion, and dummy fill insertion to result in a modified layout (1206). Since the layout should be checked for both manufacturability and electrical correctness, layout verification comprises manufacturing check (1213) and electrical check (1214). Manufacturing check (1213) verifies that the layout shapes will result in proper delineation of features onto the wafer, and electrical check (1214) verifies that the delineated features will form proper circuit elements.

Figure 13:
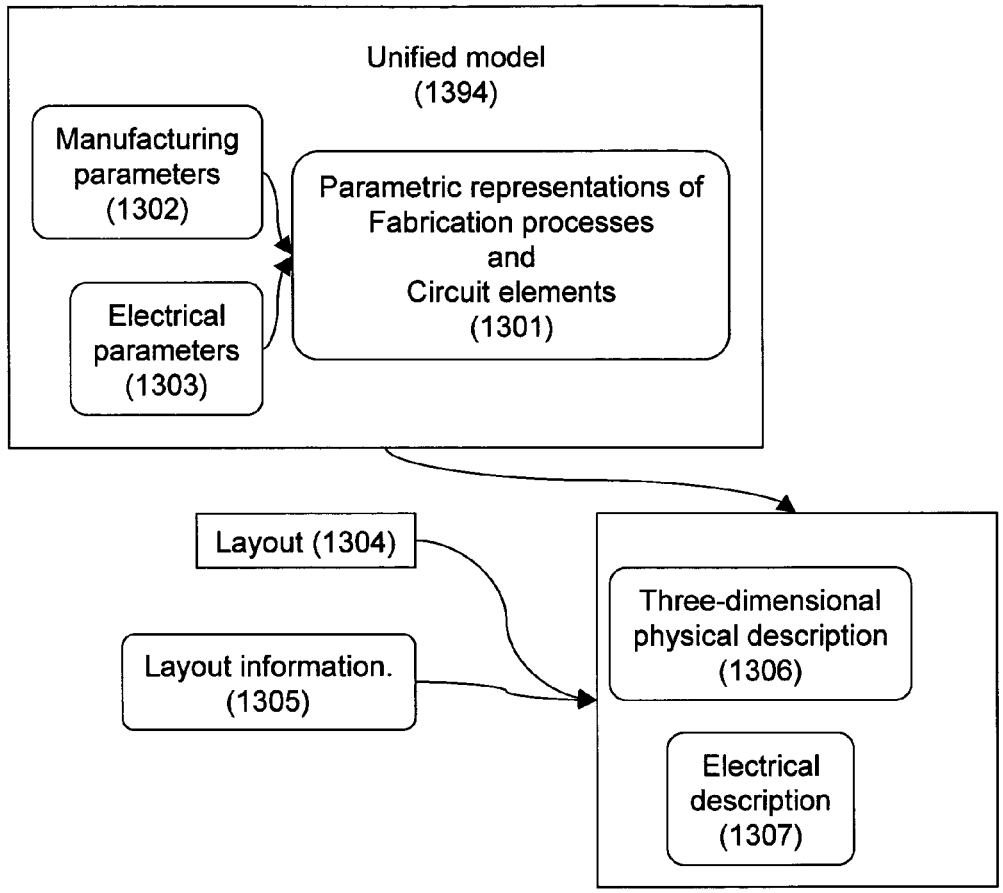
FIG. 13 illustrates the unified model of manufacturing processes and circuit elements.

FIG. 13 illustrates the unified model of manufacturing processes and circuit elements that manufacturing and electrical checks require. Central to the unified model (1394) are parametric representations of fabrication processes and circuit elements (1301). Such parametric representations may include models for lithography, mask-making (including lithography and etch steps), oxidation, deposition, etching, ion implantation, thermal steps (including annealing and reflow), epitaxy, and CMP for fabrication processes, and models for transistor, capacitors, inductors, and resistors/conductors for designed and parasitic circuit elements. A parametric representation normally portrays one fabrication process (such as a lithography process or a CMP process) or a circuit element (such as a transistor or a capacitor). But it can also represent more than one process or circuit element. Parameters of the parametric representations comprise manufacturing parameters (1302) and electrical parameters (1303). Manufacturing parameters stipulate quantities related to fabrication processes such as the wavelength used to expose a certain mask level, the pressure of the CMP pads, and process variations and fluctuations including alignment accuracy between mask levels. Electrical parameters designate quantities related to circuit elements such as dielectric constants of materials, breakdown fields of materials, and leakage current levels. Given a layout (1304) and related layout information (1305) such as layer mapping, the unified model, together with its associated manufacturing parameters (1302) and electrical parameters (1303), provides a three-dimensional physical description of the layout (1306) as well as electrical descriptions of circuit elements defined by the layout (1307).

Because the unified model includes parametric representations of different fabrication processes and circuit elements, the physical and electrical descriptions can be determined by taking into consideration the interdependence among different processing steps and circuit elements, giving the descriptions improved accuracy. The unified model can also take into consideration the propagation of manufacturing errors from level to level. For example, lithography imaging of a mask level can be computed using wafer flatness information obtained from CMP modeling (to be discussed in [00103]); electrical behavior of a circuit element can be determined by taking into account process variations and placement error (to be discussed in [00116]).

As an example of interdependence among parametric representations, consider a process sequence in which CMP is followed by photolithography. The parametric representation of the CMP process can be $$z(x, y) = \begin{matrix} z_0 - |Kt/\rho(x, y)| & t \le (\rho z_1/K) \\ z_0 - z_1 - Kt + \rho(x, y)z_1 & t \ge (\rho z_1/K) \end{matrix}$$

where $z(x, y)$ is the oxide thickness at location $(x, y)$, $K$ is the blanket polishing rate, $z_0$ is the height of deposited oxide, $z_1$ is the height of the topography before CMP, $t$ is the polishing time, and $p(x, y)$ is the pattern density. The oxide thickness as a function of position $z(x, y)$ can be used in determining the intensity distribution of the lithography process, whose parametric representation can be:

$$I(x,y,z)=\int\Lambda\int TCC(f',g';f'',g'';z)O(f'g')O^*(f'',g'')e^{+i2\pi[(f'-f'')x+(g'-g'')y]}df'dg'df''dg''$$

where $I(x, y, z)$ is the image intensity at location $(x, y)$, $TCC(f', g'; g''; z)$ is the transmission cross coefficient, $O(f', g')$ is the spectrum of the mask, $\{f', g, f'', g''\}$ are spatial frequency variables, and z includes oxide thickness variation arising from CMP.

Figure 14:
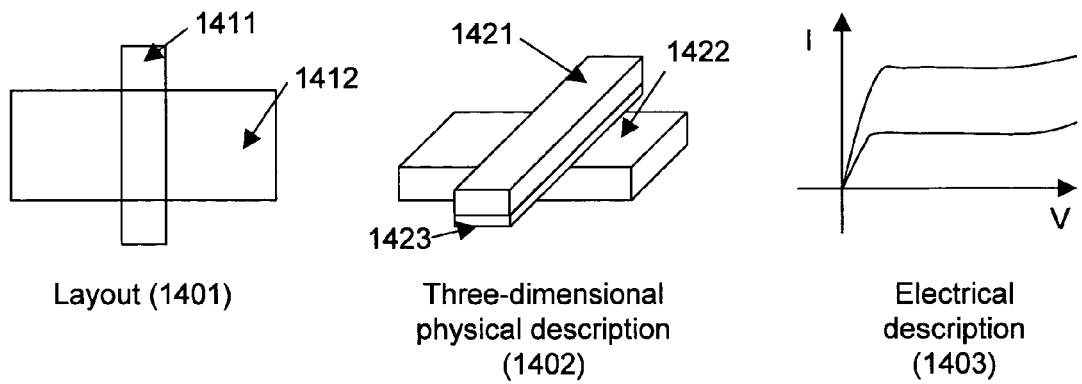
FIG. 14 shows an application of the unified model.

FIG. 14 shows an application of the unified model described in FIG. 13. In this example, the layout (1401) has two shapes, (1411) belonging to layer number A and (1412) belonging to layer number B. From the supplied layout information, layer number A corresponds to the polysilicon level and layer number B corresponds to the active area level. Intersection of shapes (1411) and (1412) forms a MOSFET transistor. With its manufacturing parameters, the unified model gives a three-dimensional physical description of the layout (1402). This three-dimensional physical description includes the geometry of the active area (1422) (or equivalently, the associated geometry of the isolation region), the gate oxide (1423), and the polysilicon gate (1421). Together with the electrical parameters of the unified model, the physical description can be used to derive the electrical description of the transistor. The electrical description in general includes a variety of characterizations such as the large-signal and small-signal behaviors, leakage current, and breakdown field; it is represented by the current-voltage characteristic (1403) in FIG. 14.

Figure 15:
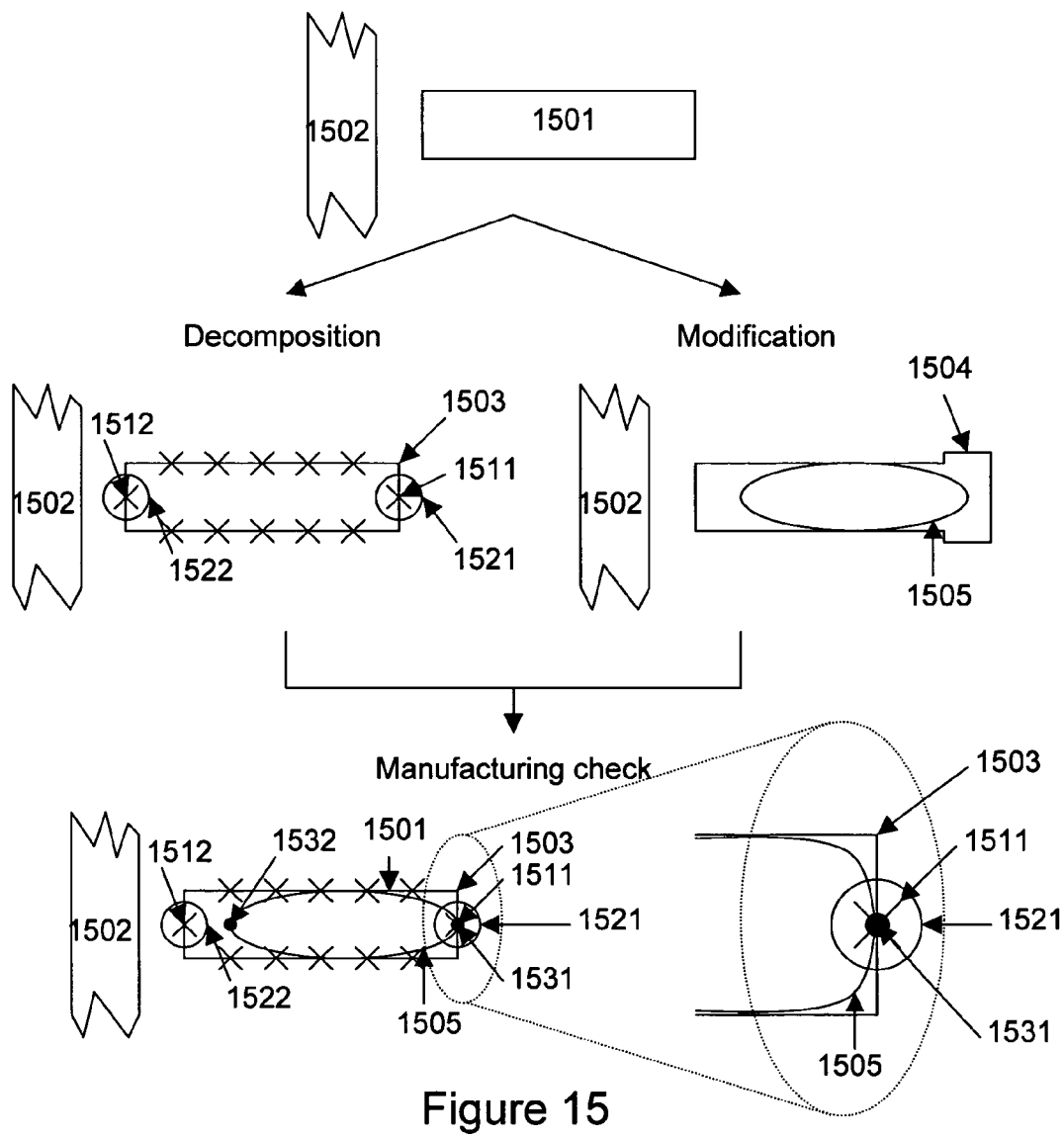
FIG. 15 illustrates a manufacturing check using decomposed points.

With such a unified model, the manufacturing check (1213) expressed in FIG. 12 can be implemented according to the example shown in FIG. 15. In this example, the layout comprises two rectangles (1501) and (1502). The rectangle (1501) is decomposed into twelve points denoted by crosses (1503), of which only two are labeled in the figure as (1511) and (1512). Although the decomposition points are regularly placed around the rectangle (1501) in this example, they can be non-uniform and arbitrarily placed in general. They can also be placed at positions inside and outside layout shapes for purposes such as topography check. Associated with each decomposition point is a tolerance region such that region (1521) corresponds to decomposition point (1511) and region (1522) corresponds to decomposition point (1512). Tolerance regions of other decomposition points are not drawn in the figure. The sizes and shapes of the tolerance regions can be specified as manufacturing parameters of the unified model. These tolerance regions are in generally three-dimensional volumes.

In addition to decomposition, the layout can be modified, where appropriate, for techniques such as OPC, phase-shifting conversion, and dummy fill insertion. In FIG. 15, shape (1501) is pre-distorted to give the modified rectangle (1504). The three-dimensional physical description of the modified rectangle (1504), i.e., the expected delineation of rectangle (1504) onto the wafer, can be computed using the unified model. For ease of exposition, the physical description is represented by the two-dimensional shape (1505) in the figure.

Using the physical description (1505) and the decomposed representation (1503), manufacturing check can be performed, as shown by the lower diagram in FIG. 15. For each decomposition point, the check can be performed by determining whether the modeled location of the decomposition point falls within the tolerance region of the decomposition point. The modeled location of decomposition point (1511) is the filled circular dot denoted by (1531). This modeled location (1531) falls within the tolerance region (1521) corresponding to decomposition point (1511). Decomposition point (1511) thus passes manufacturing check. For decomposition point (1512), the modeled location (1532) falls outside the tolerance region (1522), indicating a manufacturing check failure. This manufacturing check failure and the location of decomposition point (1512) constitute part of the decision and output data of layout verification.

Another implementation of manufacturing check is to compute the distance between the decomposition point and the modeled location, and compare this distance with a threshold value. The distance can be the Euclidean separation of the decomposition point and the modeled location; it can also be a more complicated metric such as a function of the differences in the Cartesian components of the decomposition point and the modeled location. The threshold value can be derived from a parameter of the unified model, or from input data and controls of layout verification, or from a combination thereof. Manufacturing check fails if the distance is larger than the threshold value.

In addition to checking whether the modeled location of the decomposition point falls within the tolerance region of the decomposition point, the manufacturing check can also include a process latitude check using metrics defined to denote sensitivity of delineated locations with respect to process variations. Process latitude metrics include the modulation transfer function, contrast, exposure latitude, image log slope, normalized image log slope, depth of focus, exposure-defocus window, total window, sensitivity to mask critical dimension error, sensitivity to aberrations, common window, and linewidth variability. Process latitude check can be applied to a decomposition point by, for example, specifying a threshold process latitude metric value, and comparing this threshold value with the process latitude metric value computed at the decomposition point. The threshold can be derived from the manufacturing parameters of the unified model.

Figure 16:
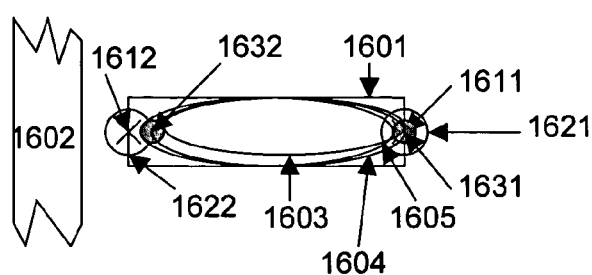
FIG. 16 illustrates a manufacturing check using multiple physical descriptions representing different processing conditions.

Another implementation of process latitude check is to compute the three-dimensional physical descriptions at different processing conditions. These different conditions represent reasonable amounts of fluctuation from nominal processing conditions. FIG. 16 illustrates the principle. The layout comprises the two rectangles (1601) and (1602). Rectangle (1601) has two decomposition points (1611) and (1612) with their corresponding regions of tolerance (1621) and (1622). The unified model, when applied multiple times at different processing conditions on rectangle (1601) or, if appropriate, its modified shape, gives different physical descriptions. The various process conditions can be determined using an experimental-design-like approach or in a Monte Carlo manner. The number of physical descriptions can be numerous in actual applications, but they are represented by the three shapes (1603), (1604), and (1605) in FIG. 16. From these physical descriptions a territory of modeled locations can be formed for each decomposition point. The territory of modeled locations encompasses the modeled locations of the decomposition point at the different processing conditions. In FIG. 16, decomposition point (1611) forms the territory of modeled locations (1631) and decomposition point (1612) forms the territory (1632). These territories are shaded in gray. Since the territory of modeled locations (1631) corresponding to decomposition point (1611) falls entirely within the region of tolerance (1621), decomposition point (1611) passes manufacturing check. On the other hand, parts of the territory of modeled locations (1632) corresponding to decomposition point (1612) falls outside the region of tolerance (1622). The decomposition point (1612) thus fails manufacturing check.

The examples discussed in FIG. 15 and FIG. 16 use decomposition points for manufacturing check. The check can also be performed using shapes instead of points, as shown in FIGS. 17a and 17b. In FIGS. 17a and 17ba, the layout comprises two rectangles (1701) and (1702). Let us focus on manufacturing check of rectangle (1701), which is decomposed into four smaller rectangles (1703), (1704), (1705), and (1706). The decomposed shapes can have different and arbitrary geometries in general, although they are all rectangles in this example. They can also be created in regions outside the layout shapes for purposes such as topography check. A region of tolerance can be defined for each decomposed shape. Focusing on decomposed rectangle (1706), a region of tolerance (1707) can be defined as shown by the area shaded in gray. The sizes and shapes of the tolerance regions can be specified by the manufacturing parameters of the unified model. Although the region of tolerance (1707) is shown as a two-dimensional shape in the figure for expositional convenience, tolerance regions are in general three-dimensional shapes describing the extent of allowable shape deviation in the plane of the layout and the permissible height variation along the wafer stack direction.

Manufacturing check can then proceed by determining whether the physical descriptions resulting from the unified model fall within the tolerance regions. The number of physical descriptions to use can be one or more than one, depending on whether process variations are taken into consideration. The manufacturing check shown in FIGS. 17a and 17ba show an example using three physical descriptions. The check fails because one of the physical descriptions barely falls outside the tolerance region (1707). This failure is highlighted by the circle (1708).

Another method, for determining whether a physical description falls within a tolerance region is illustrated in FIGS. 17a and 17b. Associated with target wafer shape (1711) are two tolerance surfaces: a minimum tolerance surface (1712) and a maximum tolerance surface (1713). We can perceive the tolerance region associated with the target wafer shape (1711) as the volume between the minimum and maximum tolerance surfaces. Manufacturing check can then proceed by evaluating whether the physical description (1714) encloses the minimum tolerance surface (1712) and whether the maximum tolerance surface (1713) encloses the physical description (1714). Simultaneous fulfillment of both criteria indicates passing of manufacturing check. In the special case where the tolerance region is a two-dimensional surface, the tolerance surfaces become curves.

Besides manufacturing check, electrical check (1214) expressed in FIG. 12 can be implemented using the unified model according to the example shown in FIG. 18a–18c. The layout shown in FIG. 18a is a part of a complementary metal-oxide silicon (CMOS) inverter. It comprises three shapes (1801), (1802), and (1803). Rectangles (1801) and (1802) are the transistor active areas for the p-type and n-type transistors. Shape (1803) belongs to the polysilicon level. Intersections of polysilicon and active area form the transistor gates. A decomposition of the layout can result in the shapes shown in FIGS. 18a and 18b, where shape (1803) is decomposed into three rectangles (1804), (1805), and (1806). (Note that decomposition of the layout for electrical check may be different from the decomposition for manufacturing check.) The rectangles (1801) and (1802) are intact. The shapes of the decomposed layout are then identified with circuit elements. Three circuit elements can be identified from the decomposed layout shown in FIG. 18b: a first transistor comprising shapes (1801) and (1805), a second transistor comprising shapes (1802) and (1806), and a conductor (1804). Let us focus on electrical check of the second transistor consisting of shapes (1802) and (1806). In general electrical check verifies many properties of the circuit elements. To illustrate the principle, the check will be restricted to leakage current verification, with the requirement that the transistor leakage current must be less than the maximum allowable leakage current $I_{leakage,max}$. The value of $I_{leakage,max}$ can be derived from the electrical parameters of the unified model. Applying the unified model on the decomposed shapes (1802) and (1806) gives their three-dimensional physical descriptions (1807) and (1808), as shown in FIG. 18c. Transistor parameters can then be determined from these physical descriptions. With these parameters, a CMOS parametric representation within the unified model can compute the leakage current $I_{leakage,max}$. In the case that $I_{leakage}$ is larger than $I_{leakage,max}$ electrical check fails. This failure and the location of the circuit element constitute part of the decision and output data of layout verification.

Figure 19A:
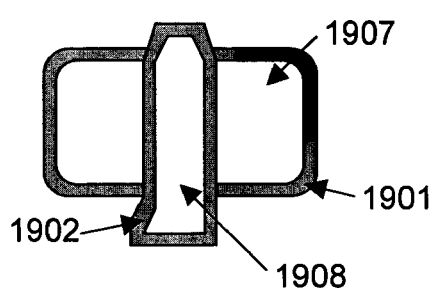
FIGS. 19a and 19b illustrate an electrical check with placement fluctuations.
Figure 19B:
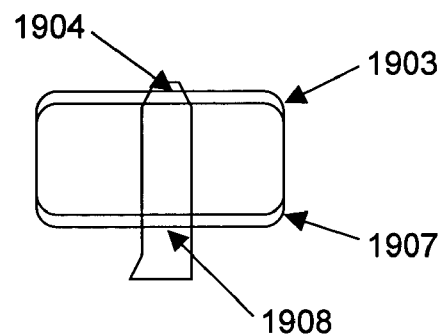

The electrical check can also consider placement fluctuations such as misalignment between different mask levels. Each shape has a zone of placements corresponding to the possible placements of the shape on the wafer due to placement variations in the fabrication process. The amounts of displacement can be derived from the manufacturing parameters of the unified model. Zones of placements for the physical descriptions (1807) and (1808) in FIG. 18c are illustrated in FIG. 19a. The physical description of the active area (1907) has the zone of placements (1901); the physical description of the polysilicon shape (1908) has the zone of placements (1902). These zones of placements are shaded in gray. Electrical check in this case should ensure that the circuit element functions properly with arbitrary positioning of shapes within their zones of placements. For example, in one positioning of shapes shown in FIG. 19b, the physical description of the active area (1907) is shifted upwards to the physical description (1903), representing an alignment error in the vertical direction. Electrical check should be performed on the transistor formed from shapes (1903) and (1908). In this example the leakage current increases because of the shorter gate length at location (1904) due to the vertical misalignment.

Figure 20:
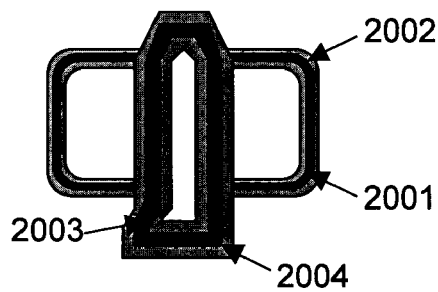
FIG. 20 illustrates an electrical check with placement fluctuations and processing variations.

The situation depicted in FIG. 19 describes the situation where only a placement error has occurred. The physical descriptions (1903) and (1907) are identical except for a displacement. To take into consideration both placement error and process fluctuations causing physical description variations, a zone of placements and a territory of modeled locations can be used simultaneously. This is shown in FIG. 20. The territory of modeled locations associated with the active area shape is labeled (2001), and the territory of modeled locations associated with the polysilicon shape is labeled (2003). Both are shaded in black. Territories of modeled locations can be obtained by applying the unified model at different processing conditions, where the conditions can be determined using an experimental-design-like approach or in a Monte Carlo manner. Zones of placements can be determined by considering the possible placements of the territories of modeled locations on the wafer due to placement variations. The zone of placement corresponding to the active area shape is labeled (2002) in FIG. 20, and that corresponding to the polysilicon shape is labeled (2004). These are shaded in gray. Electrical check in this case should ensure that the circuit element functions properly with arbitrary positioning of territories of modeled locations within their zones of placements.

The physical descriptions of shapes used in the electrical checks described above are obtained from the parametric representations of fabrication processes and circuit elements within the unified model. These parametric representations can be theoretical such as computing the imaging equations for the photolithography process, or they can be approximate or based on heuristics such as mimicking the pattern transfer process by rounding corners in layouts. They can also contain parameters that should be calibrated to experimental data from fabrication processes and circuit element characterizations.

Instead of using physical descriptions of the layout obtained from the unified model, electrical check can also be performed using target wafer shapes rather than physical descriptions of layout shapes.

Layout verification using the unified model as shown in FIG. 12 enables functionalities unavailable with existing DRC as depicted in FIG. 2. Robustness of layouts can be adjusted by changing the manufacturing and electrical parameters of the unified model, making the verifications more stringent or less stringent. The degree of manufacturability can thus be varied. Weak spots in layouts can also be found by examining the deviation in output data from different layout verifications performed with parameters of differing degrees of manufacturability.

Figure 21:
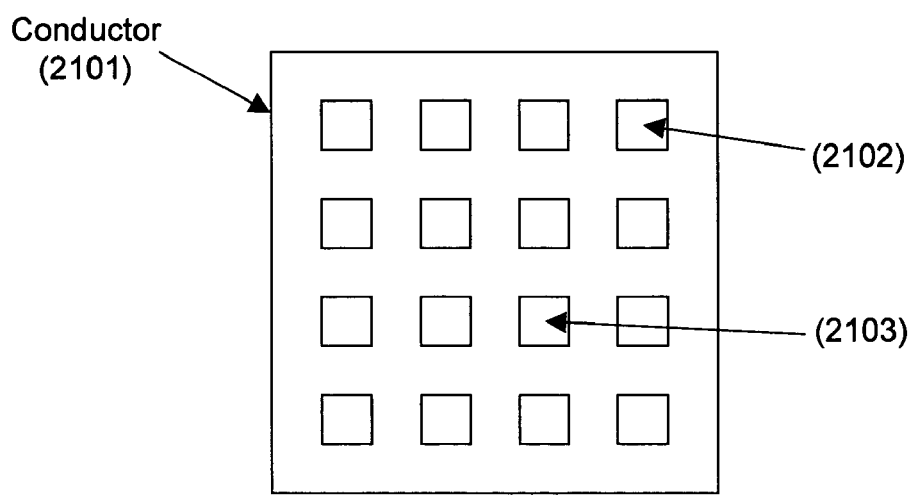
FIG. 21 illustrates the layout of an array of redundant contacts.

The unified model also allows intelligent layout verification. The capability to derive electrical information from layouts means that manufacturing check criteria for shapes, even though they may be of identical geometry, can differ depending on the function of the shapes in the circuit. Moreover, manufacturing check failure of a particular shape does not necessarily mean failure of layout verification as a whole. An example of intelligent layout verification is shown in FIG. 21, where the layout comprises an array of contacts connected to the same conductor (2101). Manufacturability of contacts at the periphery of an array such as (2102) is, in this example, lower than those located in the inner region of the array such as (2103), so that the peripheral contacts may fail manufacturing check whereas the inner contacts pass. But the unified model can deduce that these contacts are redundant. Failure of the peripheral contacts does not affect circuit functionality, and the layout can pass layout verification as a whole. A criterion can be set, for example, that a certain percentage or a minimum number of redundant contacts should pass manufacturing check for the entire array to pass layout verification as a whole.

In addition to DRC, the unified model can replace design rules in areas of IC creation where IC designers need to work with the layout. These include routing, compaction, extraction, layout editing, and standard cell generation.

Figure 3:
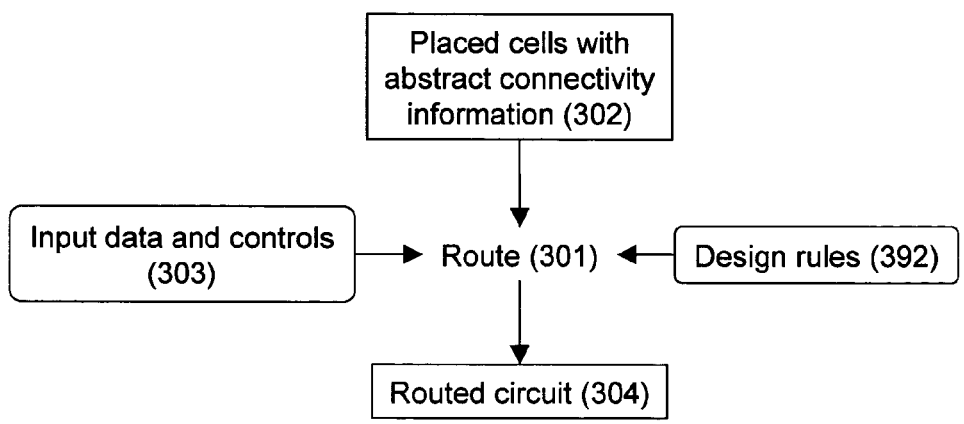
FIG. 3 illustrates a high-level view of routing using design rules.
Figure 22:
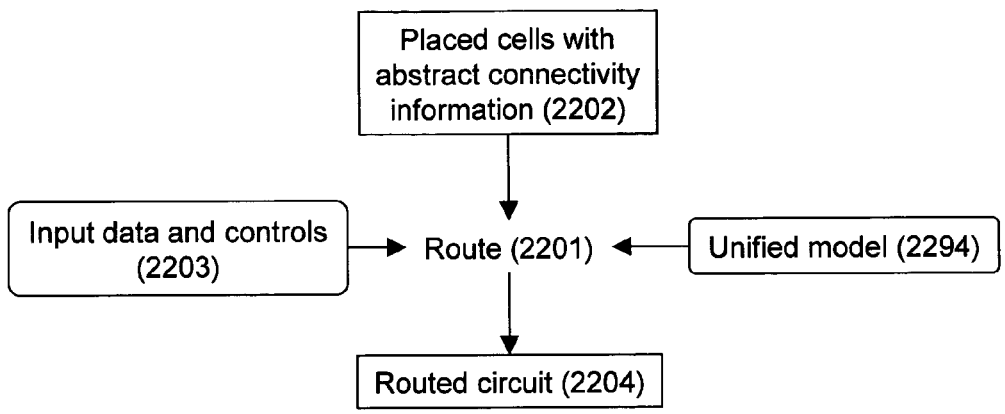
FIG. 22 illustrates a high-level view of routing using the unified model.

FIG. 22 depicts a high-level view of routing using the unified model. Necessary ingredients to the routing process (2201) include the placed cells with their abstract interconnectivity information (2202), input data and controls (2203), and the unified model (2294). Input data and controls can include physical information of the cells such as their sizes, shapes, and pin locations; they can also include the number of interconnect levels of the particular technology that the IC will be fabricated with and specifications on the permitted routing regions. Based on the provided information, the routing process converts abstract connections into physical connections between cells, resulting in a routed circuit (2204). Instead of using design rules as in the routing process (301) depicted in FIG. 3, the routing process (2201) uses the unified model to perform layout verification on the layouts of potential physical connections. The decisions from layout verification are used in weighting the desirability of these potential physical connections.

Figure 4:
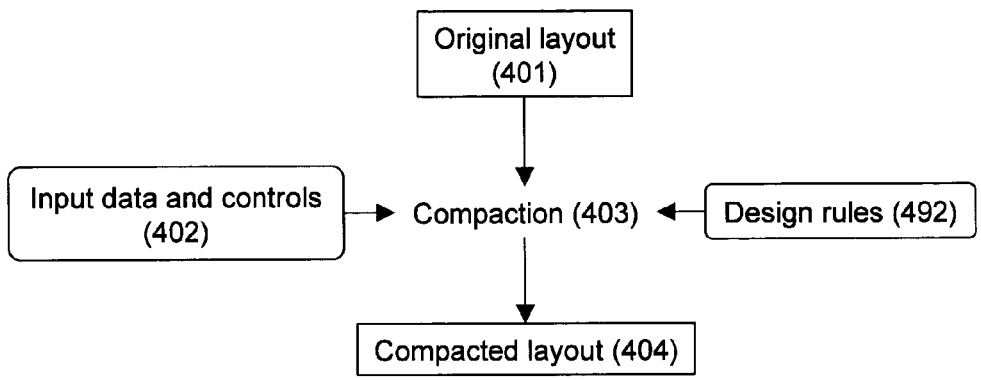
FIG. 4 illustrates a high-level view of compaction using design rules.
Figure 5:
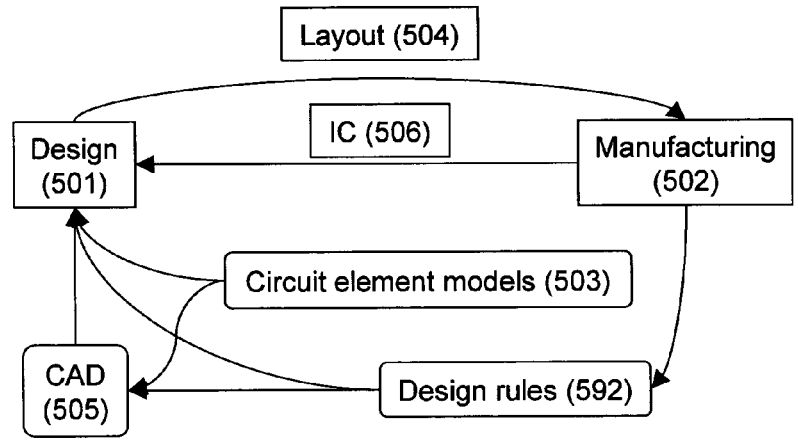
FIG. 5 encapsulates the existing IC creation process.
Figure 23:
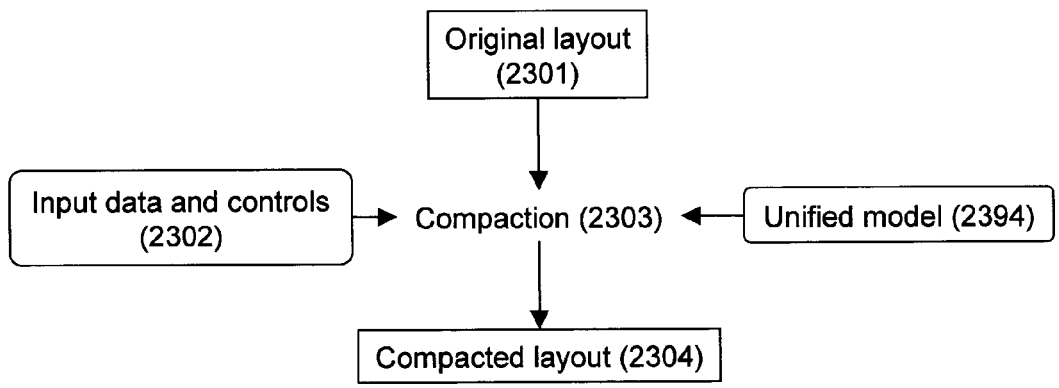
FIG. 23 illustrates a high-level view of compaction using the unified model.

A high-level view of compaction with the unified model is illustrated in FIG. 23. With an original layout (2301) and controls of the compaction process (2302), compaction (2303) shrinks the original layout (2301) such that the compacted layout (2304) generally occupies less area than the original layout (2301). Instead of using design rules in the compaction process (403) depicted in FIG. 4, this compaction process (2303) uses the unified model (2394) to perform layout verification on the layouts of potential compacted layouts. The decisions from layout verification are used in weighting the desirability of these potential compacted layouts.

Figure 6:
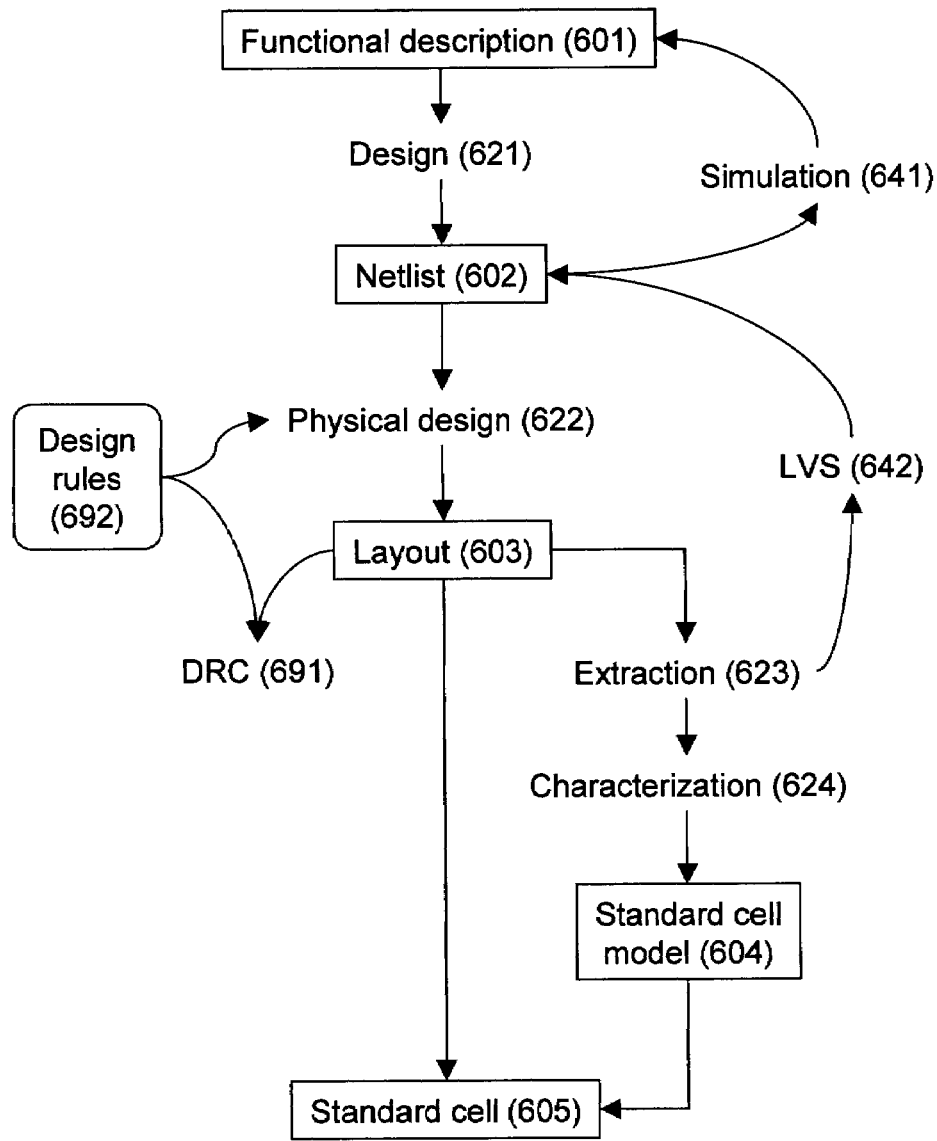
FIG. 6 illustrates a standard cell creation process using design rules.
Figure 7:
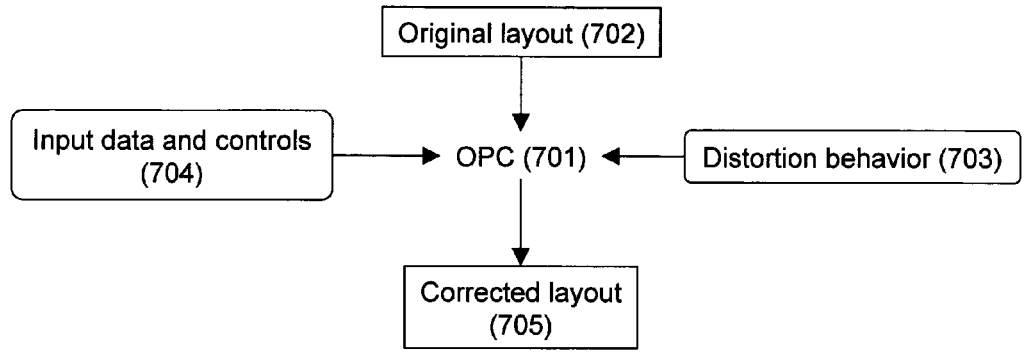
FIG. 7 illustrates a high-level view of OPC.
Figure 24:
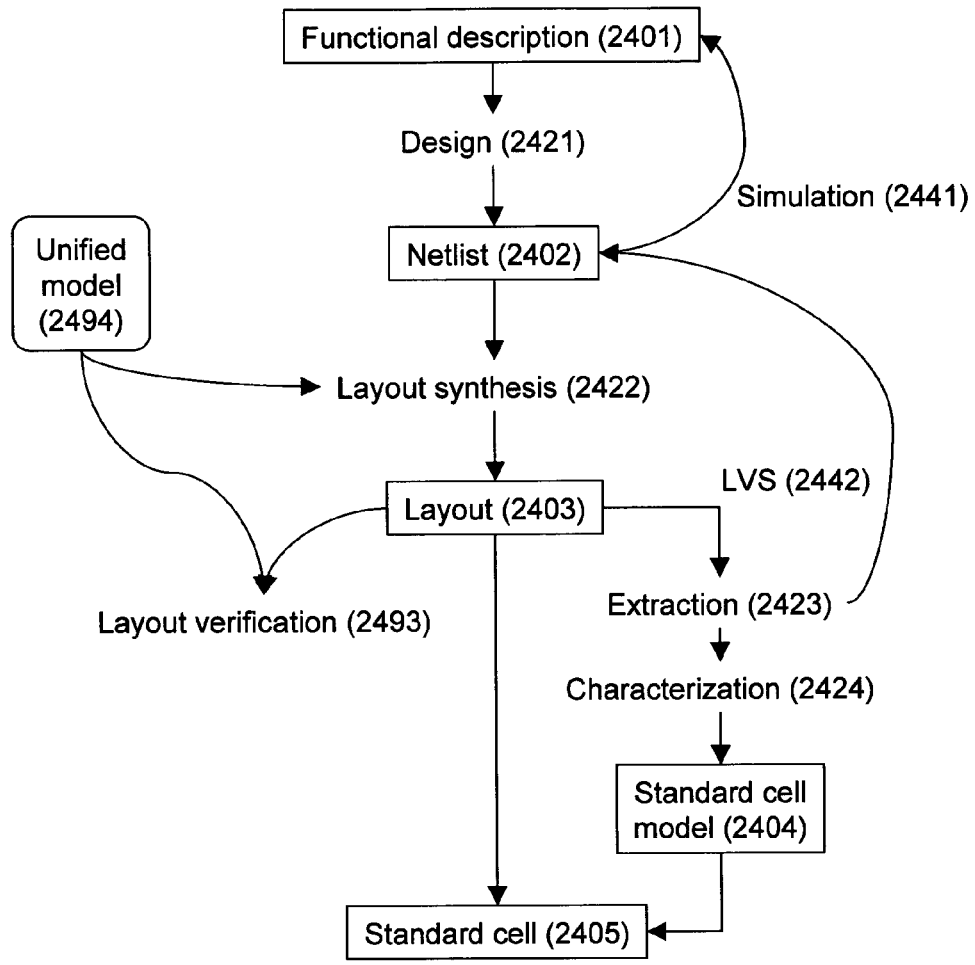
FIG. 24 illustrates a standard cell creation process using the unified model.

Standard cell creation using the unified model is shown in FIG. 24. From the functional description (2401), a standard cell is first designed (2421) by specifying the circuit elements needed and their interconnection. This netlist (2402) is then verified by schematic or circuit simulation (2441) to ensure that performance goals are met. Translation of the netlist into a layout (2403), i.e., layout synthesis (2422), is guided by the unified model (2494). Instead of using design rules as in the standard cell generation process shown in FIG. 6, physical design (2422) uses the unified model to perform layout verification on the potential layout realizations of the netlist. The decisions from layout verification are used in weighting the desirability of these potential layout realizations. Physical design can be accomplished by CAD synthesis, manual drawing, or a combination. The layout (2403) then undergoes extraction (2423). Circuit extraction uses the layout to derive circuit elements and their electrical connectivity, as well as parasitic information on circuit elements for physical verification. Functional verification can be accomplished by LVS (2442). Manufacturability verification can be performed by layout verification (2493). The extracted information is also used for characterization (2424) of the standard cell. Such characterization may include input capacitance of the standard cell, pin-to-pin propagation delays, power dissipation, and setup and hold time for sequential elements. The characterized data are turned into a model of the standard cell (2404). The standard cell model (2404) together with the layout (2403) forms the standard cell (2405), which can be used in various steps in the IC creation flow including synthesis, and place and route.

Figure 25:
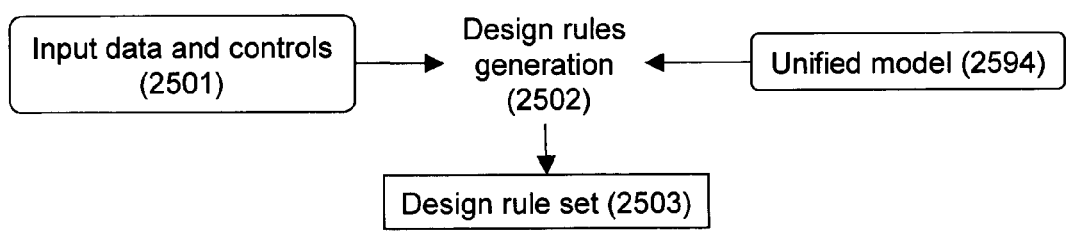
FIG. 25 illustrates a high-level view of design rules generation using the unified model.

Design rules can also be derived from the unified model, as shown in FIG. 25. Design rules generation (2502) is constrained by input data and controls (2501) that limit the scope of design rules generated. The input data and controls can include generic quantities such as critical dimensions, and manufacturing and electrical parameters of the unified model (2594). These generic quantities control generation of common rules such as dimensions of shapes and spacing between shapes; they can be defined by filling out a template. The input data and controls can also include directives that specify generation of more sophisticated rules such as preferred design rules. With the input data and controls, the unified model (2594) is used to derive a design rule set (2504).

The unified model also improves circuit extraction. Instead of extraction from layout shapes, circuit extraction can be performed on the modeled physical descriptions of the layout shapes. The physical descriptions of the layout shapes are obtained from the parametric representations of fabrication processes and circuit elements within the unified model. The parametric representations can be theoretical, approximate, or based on heuristics. The increased accuracy of extracted circuit information such as parasitic capacitance, inductance, and resistance enables more robust performance verification.

Figure 26:
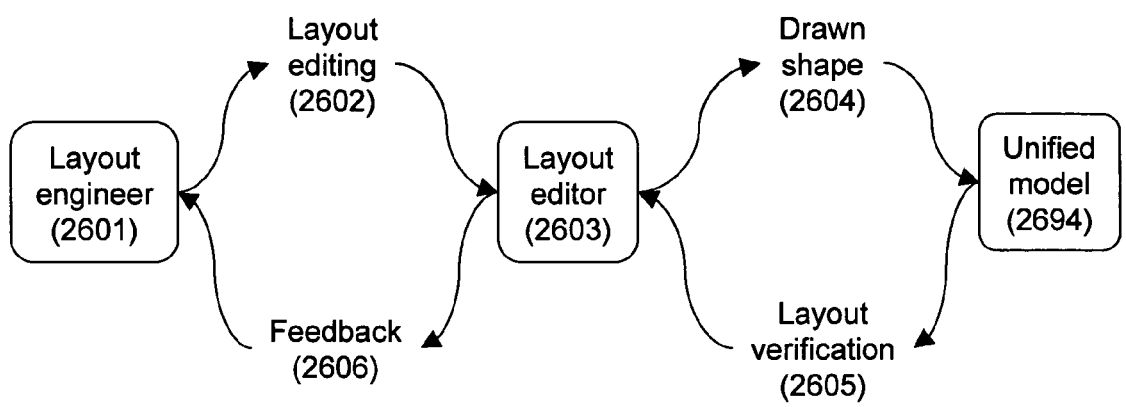
FIG. 26 illustrates an interactive layout editing process using the unified model.

The unified model can also be applied beneficially in interactive layout editing using the process depicted in FIG. 26. A layout engineer (2601) edits a layout (2602) using a layout editor (2603). Concurrent to the drawing of shapes, the drawn shape (2604) undergoes layout verification (2605) using the unified model (2694). Results of the layout verification are fed back (2606) to assist the layout engineer in drawing the layout shapes.

Figure 27:
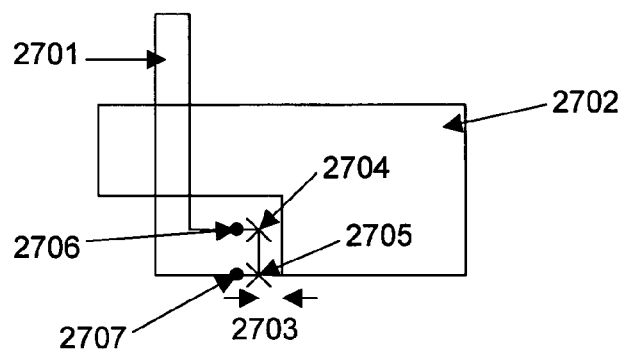
FIG. 27 illustrates a possible feedback of interactive layout editing.

An example of feedback of interactive layout editing is shown in FIG. 27. A layout engineer has drawn two shapes (2701) and (2702). The two vertices (2704) and (2705) (denoted by crosses) on shape (2701) have been drawn too close to shape (2702); the spacing (2703) fails layout verification. Using the unified model, the layout editor determines the acceptable locations of the vertices and recommends the best option for the layout engineer. In the example, the layout editor explains the undesirability of vertices (2704) and (2705) and suggests moving them to locations (2706) and (2707) (denoted by circular dots) to satisfy manufacturing and electrical constraints.

In addition to suggested vertex locations, feedback from the layout editor can be regions, gridded or continuous, of allowable vertex locations given vertices and shapes already defined, a ranked list of placement possibilities, reasons for suggesting, discouraging, or disallowing placement of vertices and shapes, and output data from layout verification (discussed in [0099]). The amount and type of feedback and their defaults can be specified and adjusted by the layout engineer using a setup file or via menu options in the layout editor. For example, the layout engineer can decide whether problematic vertices should be corrected automatically or whether vertices should be placed on a grid.

Figure 8:
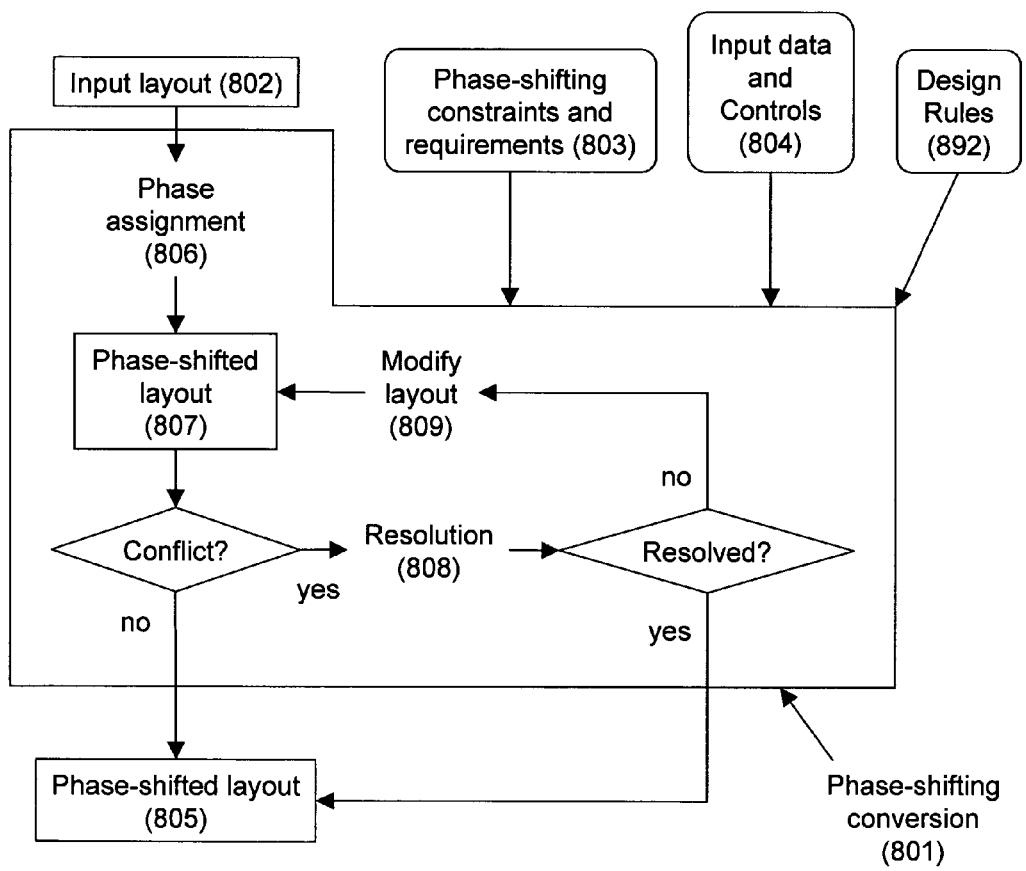
FIG. 8 illustrates an existing phase-shifting conversion process.
Figure 9:
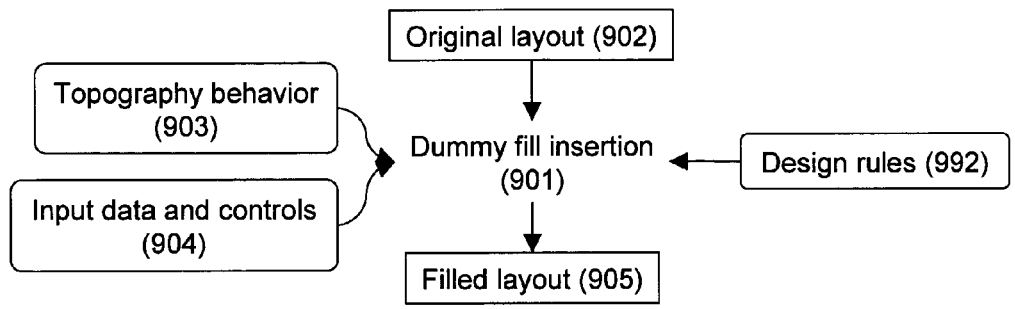
FIG. 9 illustrates a high-level view of dummy fill insertion.
Figure 10:
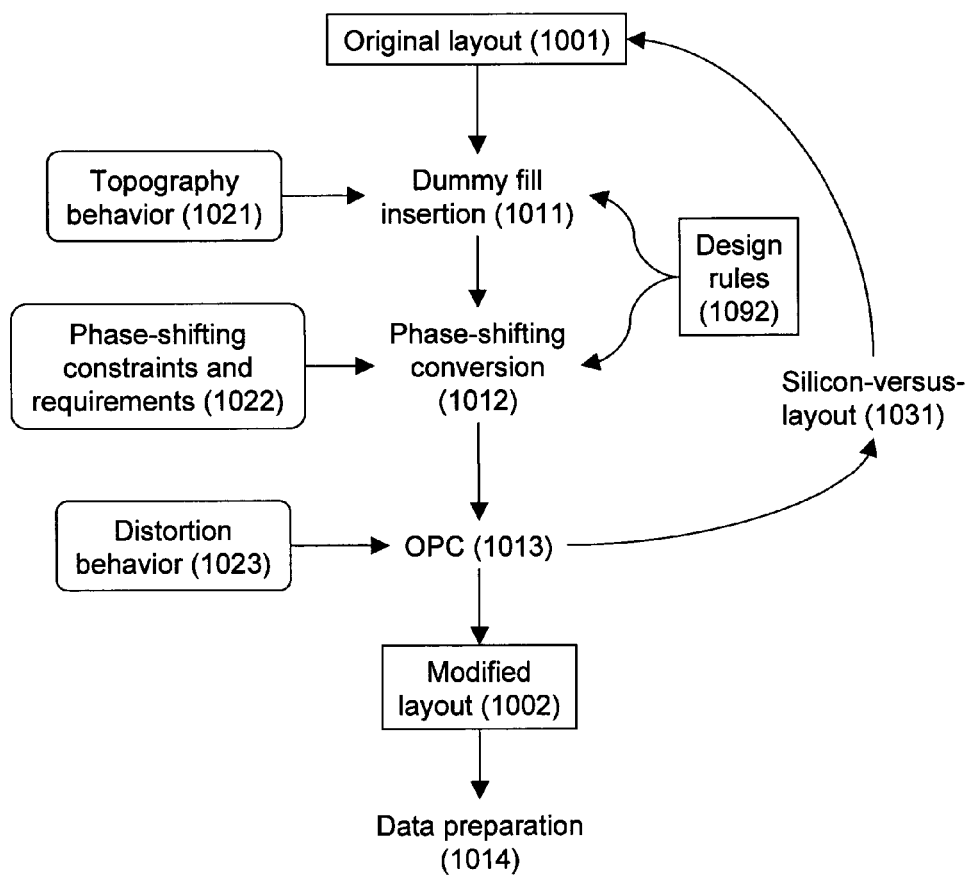
FIG. 10 shows the data flow from layout to mask data preparation.
Figure 11A:
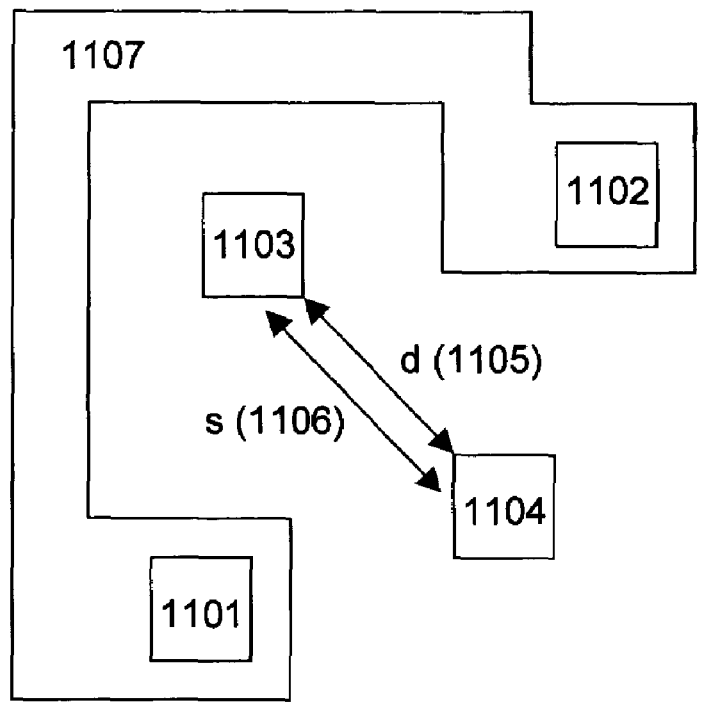
FIGS. 11a and 11b illustrate the slack in a design-rule-based routing situation.
Figure 11B:
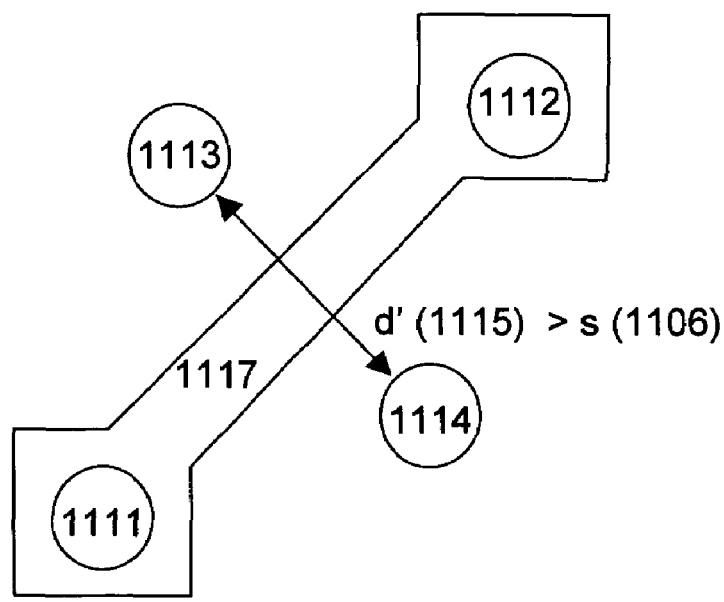
Figure 28:
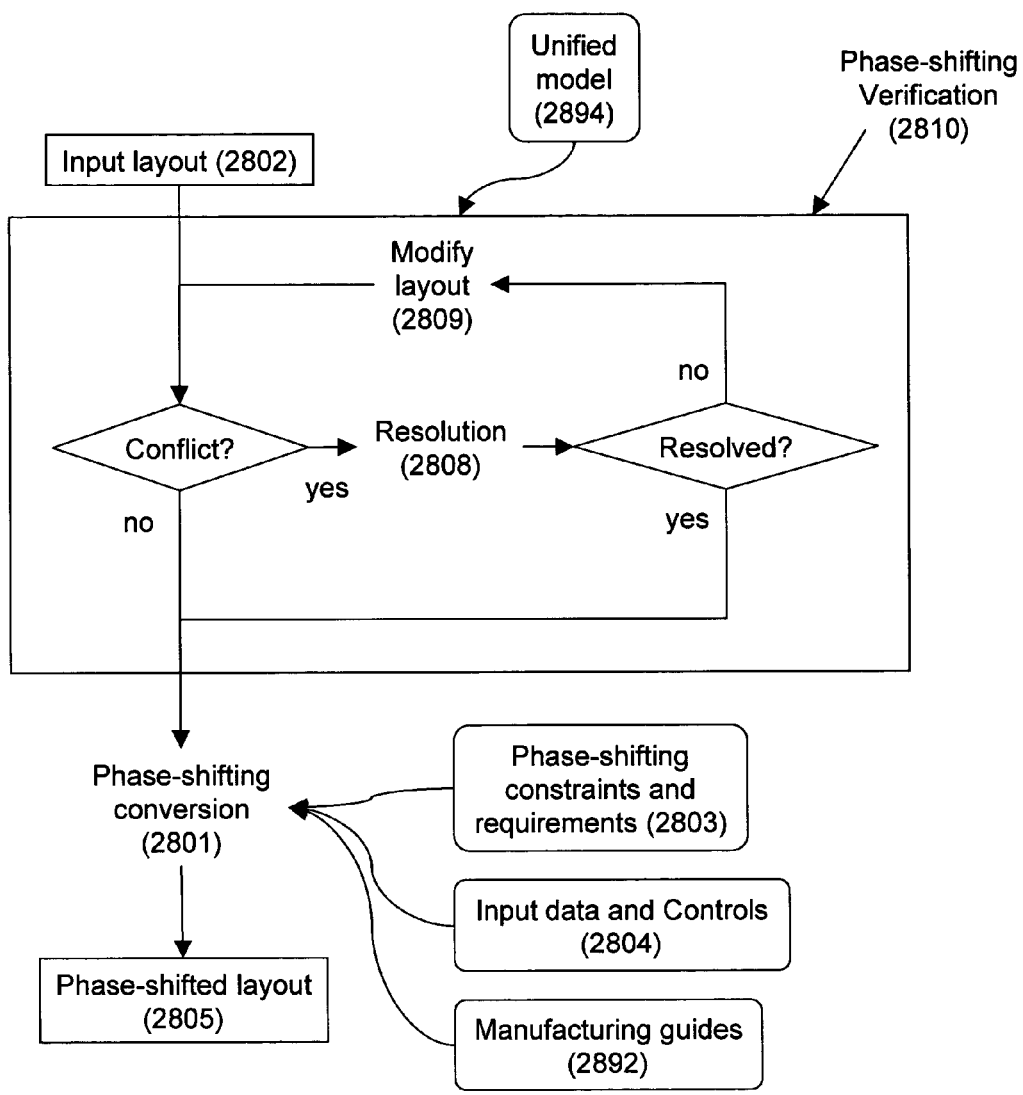
FIG. 28 illustrates phase-shifting verification and phase-shifting conversion using the unified model.

The unified model can also be used for phase-shifting verification to determine if a layout is amenable for PSM implementation. This phase-shifting verification can be a part of the manufacturing check in layout verification. The process is illustrated in FIG. 28. Given an input layout (2802) representing target wafer shapes or shapes from which target wafer shapes can be derived, the unified model (2894) is used to check the layout (2802) for existence of phase conflicts, without performing a prior phase-shifting conversion that is required with the existing practice depicted in FIG. 8. Absence of conflicts indicates that the layout (2802) is amenable to PSM implementation. Presence of conflicts necessitates conflict resolution (2808), which attempts to resolve phase conflicts within the confines of the existing layout configuration. Success of conflict resolution indicates that the layout (2802) is amenable to PSM implementation. Otherwise, the existing layout is modified (2809) to create another layout. The iteration continues until a layout amenable to PSM implementation results.

Phase-shifting conversion (2801) can be performed subsequent to phase-shifting verification (2810). The conversion is applied to the phase-shifting verified layout, taking into consideration input data and controls (2804), and phase-shifting constraints and requirements (2803). The input data and controls can include the particular PSM implementation and the portions of the layout that should be corrected. The constraints and requirements can include the minimum size of a phase region and layout configurations that cannot be properly converted. Manufacturing guides (2892) in the form of design rules or the unified model can be used in conjunction with or in place of these constraints and requirements. The result of phase-shifting conversion is a phase-shifted layout (2805) that is amenable to PSM implementation. This phase-shifted layout (2805) usually undergoes OPC subsequently for performance improvement and SiVL for verification.

Figure 29:
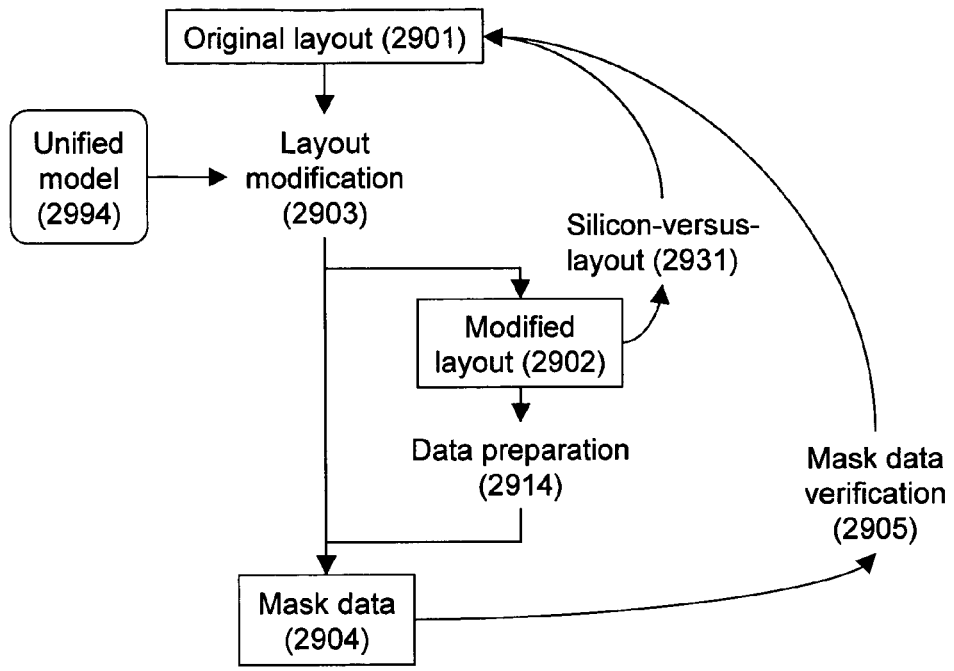
FIG. 29 illustrates an integrated layout modification process.

Containing models of the fabrication and mask-making processes, the unified model permits a closer integration of layout modification steps including OPC, dummy fill insertion, and phase-shifting conversion. For example, the topography model within the unified model enables consideration of wafer topography in OPC; a deposition model enables consideration of topography of deposited materials in dummy fill insertion. The integrated layout modification process is illustrated in FIG. 29. The original layout (2901), representing target wafer shapes or shapes from which target wafer shapes can be derived, undergoes layout modification (2903) guided by the unified model (2994). One of the first steps of layout modification can be decomposition of the original layout to create a decomposed layout that is amenable to layout modification. The decomposition scheme may be vary depending on the type of layout modification that is applied. The output of layout modification can be a modified layout (2902) on which mask data preparation (2914) can be performed, or it can be mask data (2904) if a mask-making (data preparation) model is used during the layout modification process (2903). Where appropriate, the modified layout (2902) should be verified by SiVL (2931) and the mask data should be verified by mask data verification (2905). The latter verification checks that the mask data will result in masks that produce wafer shapes that are close to the target wafer shapes specified by or derived from the original layout (2901).

The capability of the unified model to derive electrical information from layouts means that the layout modification process (2903) can determine the target shapes whose exact delineations are non-critical to circuit operations and those that are critical. The layout modification process (2903) can then decide how closely the delineated shapes should resemble the drawn layout shapes and apply the appropriate rigor in layout modification.

Figure 30:
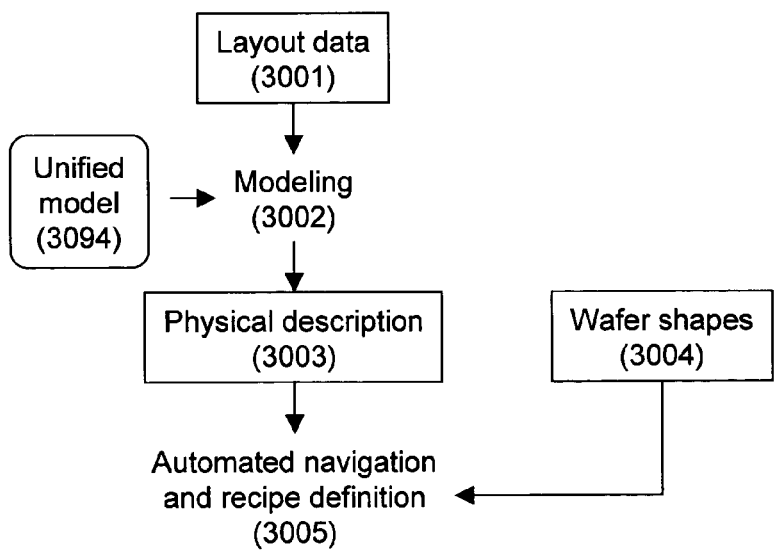
FIG. 30 illustrates an automated wafer metrology process using the unified model.

Because layout modification generally adds many shapes to the original layout, the modified layout can have little resemblance to the target wafer shapes. This lack of resemblance creates problems with automated wafer metrology using pattern recognition for navigation and recipe definition. By providing physical descriptions of the modified layout, the unified model allows automated navigation and recipe definition. The process is shown in FIG. 30. Modeling (3002) of the layout data (3001) using the unified model (3094) results in a physical description (3003) that can be used together with the wafer shapes (3004) for automated navigation and recipe definition (3005). Such a process can also be applied to automatic process control procedures.

Figure 31:
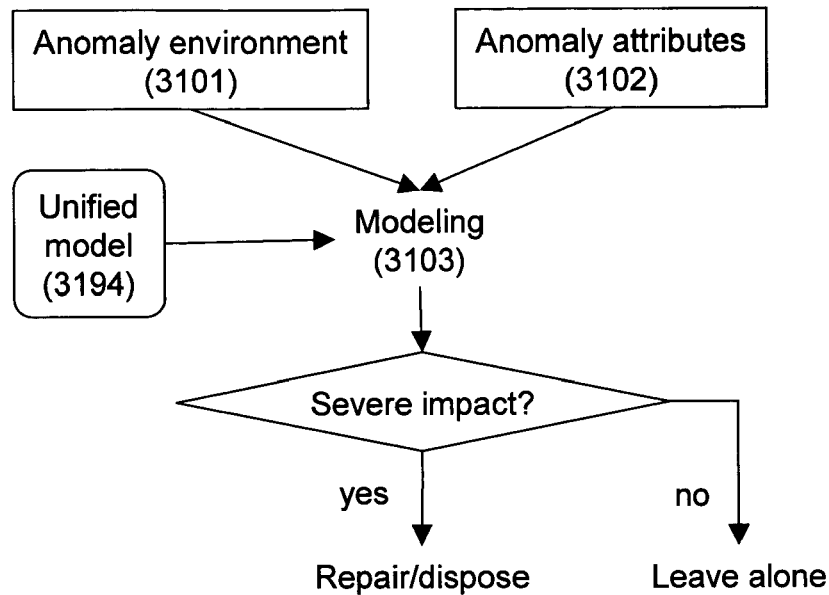
FIG. 31 illustrates a mask dispositioning process using the unified model.

The unified model can also be used to assess the manufacturing and electrical impact of a mask anomaly before deciding whether or not to repair the anomaly. The procedure is illustrated in FIG. 31. Using the attributes of the anomaly (3102) such as its shape and size and its environment (3101) such as its surrounding shapes, the unified model (3194) models (3103) the manufacturing and electrical impact of this anomaly. Should the anomaly be found to have a severe impact, the anomaly is repaired or the mask is disposed of. Otherwise, the anomaly is left unchanged.

Since the unified model provides the electrical and three-dimensional physical descriptions of a layout, the model can be used for electrical and manufacturing simulation. The procedure is illustrated in FIG. 13. Given a layout (1304) and related layout information (1305) such as layer mapping, the unified model, together with its associated manufacturing parameters (1302) and electrical parameters (1303), provides a three-dimensional physical description of the layout (1306) as well as electrical behavior of circuit elements defined by the layout (1307).

Figure 32:
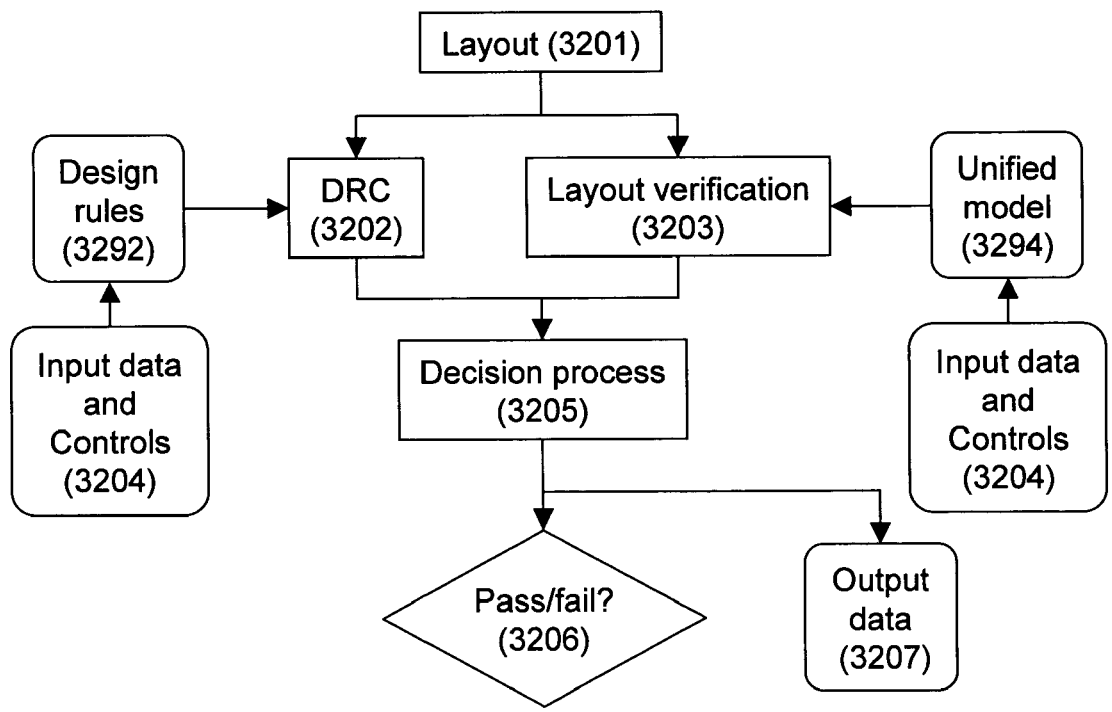
FIG. 32 illustrates verification of layout manufacturability and electrical correctness using both the unified model and design rules.

The unified model can replace design rules in IC creation steps where layouts are involved. But it can also complement design rules in applications such as layout verification, routing, compaction, extraction, layout editing, standard cell generation, and layout modification. For example, manufacturability and electrical correctness of a layout can be verified by the process illustrated in FIG. 32. Representing target wafer shapes or shapes from which target wafer shapes can be derived, the layout (3201) undergoes DRC (3202) and layout verification (3203). DRC is guided by design rules (3292) and input data and controls (3204); layout verification is guided by the unified model (3294) and input data and controls (3204). The input data and controls provide information including the specifics of the layout such as the prime (top) cell name, the layout data format, and layer mapping information. They can also control the verification by specifying the particular levels within the layout that should be verified. The results from DRC and layout verification are used by the decision process (3205) to decide if the layout is both manufacturable and electrically correct (3206). The verification may also give output data (3207) including shapes that fail certain checks, locations of these shapes, and the reasons for the failures.

In addition to verifying the manufacturability and electrical correctness of layouts, the unified model can be used together with design rules in IC creation steps where layouts are involved including layout verification, routing, compaction, extraction, layout editing, standard cell generation, and layout modification.

Figure 33:
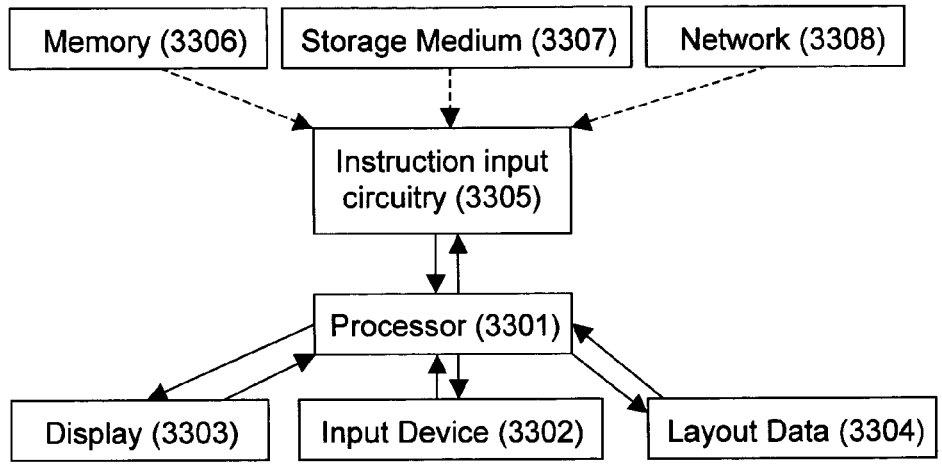
FIG. 33 provides a system view of IC creation according to the present invention.

Since the unified model is a collection of parametric representations of fabrication processes and circuit elements, it can be extended easily to include representations of new fabrication processes and physical phenomena. FIG. 33 illustrates a computer system for using the unified model on layouts in applications such as modeling and simulation, and layout manipulation including layout verification, layout editing, layout modification, routing, compaction, layout synthesis, and extraction. The system represents a wide variety of computer systems and computer architectures suitable for this application. A processor (3301) is connected to receive data indicating user signals from a user input device (3302) and to provide data to display (3303). Processor (3301) is also connected for accessing layout data (3304). Processor (3301) is also connected for receiving instruction data from instruction input circuitry (3305), which can provide instructions received from connections to memory (3306), storage medium access device (3307), or network (3308).

Figure 34:
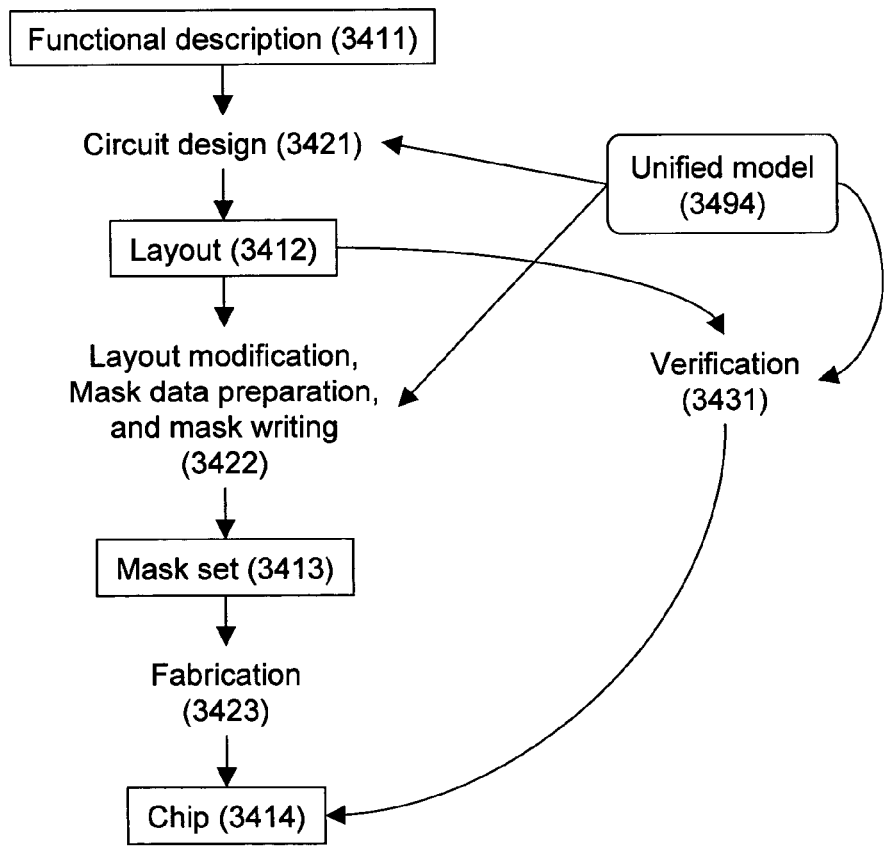
FIG. 34 shows the IC creation flow using the unified model.

FIG. 34 illustrates the design and fabrication of an IC using the unified model. From the functional description (3411) the IC is designed (3421) with the unified model (3494), giving the layout description of the circuit (3412). The layout is verified (3431) before being sent to the manufacturing team, which performs, using the unified model, layout modification, mask data preparation, and mask writing (3422), resulting in the mask set (3413) from which chips (3414) are fabricated (3423).

Figure 35:
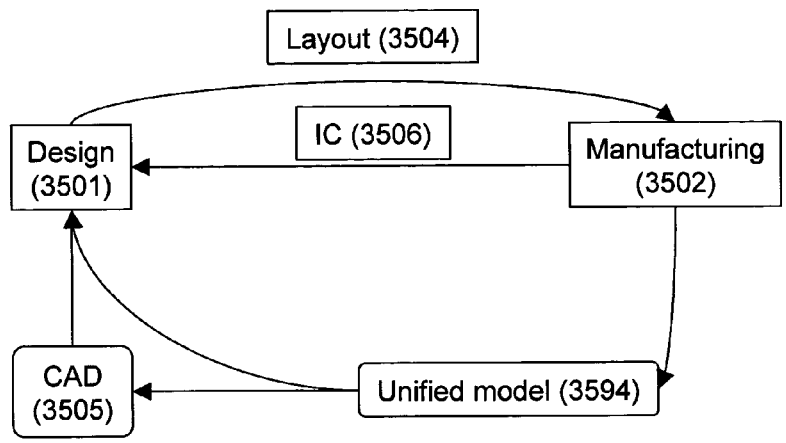
FIG. 35 encapsulates the IC creation process using the unified model.

FIG. 35 encapsulates the IC creation process using the unified model. IC creation is divided into design (3501) and manufacturing (3502) aspects. Based on the unified model (3594), circuit designers generate the layout (3504) of the IC. Such layout generation can be facilitated by the use of CAD technology (3505). From the layout, circuit manufacturers fabricate the ICs (3506).

Figure 36:
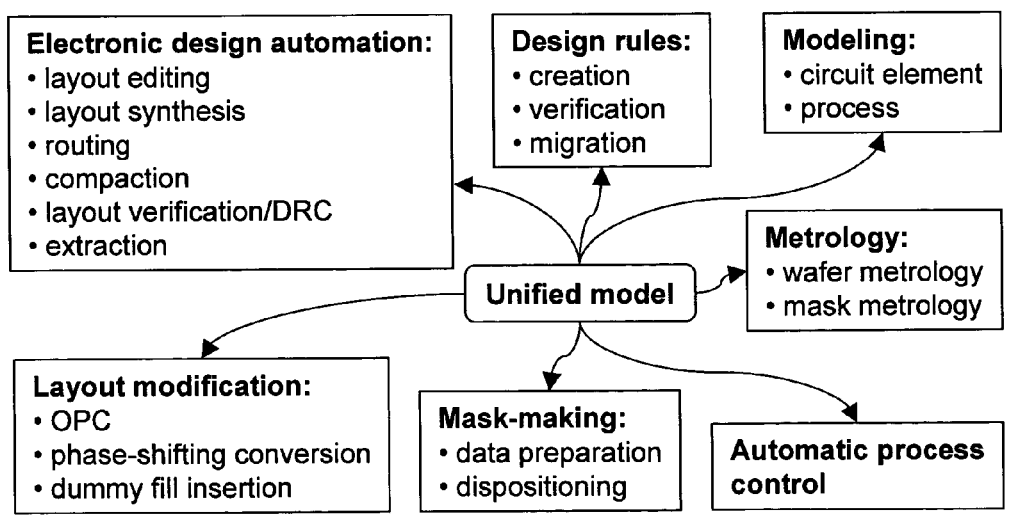
FIG. 36 illustrates the ramifications of the present invention on the aspects of the IC creation process.

In summary, the present invention requires substantial modifications of many aspects of the IC creation process. FIG. 36 summarizes some of the ramifications of this invention that are described in more detail in the previous paragraphs. The use of the invention directly impacts the following areas: electronic design automation, design rules, modeling, layout modification, mask-making, metrology, and automatic process control.

CONCLUSION

The data structures and code described in this description can be stored on a computer readable storage medium, which may be any device or medium that can store code and/or data for use by a computer system. This includes, but is not limited to, magnetic and optical storage devices such as disk drives, magnetic tapes, compact discs and DVDs (digital video disks), and computer instruction signals embodied in a transmission medium. For example, the transmission medium may include a communication network such as the Internet.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A method for obtaining a layout description for a target patterned layer of material in an integrated circuit including a plurality of patterned layers of material, comprising:
providing a layout of said target patterned layer;
providing a model that includes at least a first parametric representation characterizing at least features of the target patterned layer, and a second parametric representation characterizing at least features of the integrated circuit dependent on one of the plurality of patterned layers other than the target patterned layer; and
computing a description of a portion of said layout using said first parametric representation and said second parametric representation.

2. The method of claim 1, wherein said computing includes determining effects due to placement fluctuations, process variations, or a combination of both.

3. The method of claim 1, wherein said model is based on one of the following: physical theory, approximations, heuristics, or any combination thereof.

4. The method of claim 1, wherein said description includes one of the following: a physical description, an electrical description, or a combination of both.

5. The method of claim 1, wherein at least one of said parametric representations is one of the following parametric representations of: a lithography process, a mask-making process, an oxidation process, a deposition process, an etching process, an epitaxy process, an ion implantation process, a thermal process, a chemical-mechanical polishing process, a transistor, a capacitor, an inductor, or a resistor.

6. The method of claim 1, wherein said computing includes decomposition of said layout.

7. The method of claim 1, wherein said computing includes modification of said layout.

8. The method of claim 1, wherein said computing includes identification of a circuit element with said layout.

9. The method of claim 8, wherein said identification includes identification based on a physical description computed by said model.

10. A method for verifying a target patterned layer of material in an integrated circuit including a plurality of patterned layers of material, comprising:
providing a layout of said target patterned layer;
providing a model that includes at least a first parametric representation characterizing at least features of the target patterned layer, and a second parametric representation characterizing at least features of the integrated circuit dependent on one the the plurality of patterned layers other than the target patterned layer;
computing a target description of a portion of said layout using said target patterned layer of material;
computing a description of a portion of said layout using said first parametric representation and said second parametric representation; and
comparing said description with said target description.

11. The method of claim 10, wherein said computing a description includes determining effects due to placement fluctuations, process variations, or a combination of both.

12. The method of claim 10, wherein said description is checked against a design rule defined by the manufacturing and electrical requirements of said integrated circuit.

13. The method of claim 10, wherein said model is based on one of the following:
physical theory, approximations, heuristics, or any combination thereof.

14. The method of claim 10, wherein at least one of said parametric representations is one of the following parametric representations of: a lithography process, a mask-making process, an oxidation process, a deposition process, an etching process, an epitaxy process, an ion implantation process, a thermal process, a chemical-mechanical polishing process, a transistor, a capacitor, an inductor, or a resistor.

15. The method of claim 10, wherein said computing a description includes:
modifying said layout to obtain a modified layout; and
computing said description from said modified layout.

16. The method of claim 15, wherein said modifying includes one of the following: dummy fill insertion, phase-shifting conversion, optical proximity correction, or any combination thereof.

17. The method of claim 10, wherein said computing a description includes:
identifying a circuit element with said layout; and
obtaining said description from said circuit element.

18. The method of claim 17, wherein said identifying comprises:
decomposing said layout to obtain a decomposed geometry; and
recognizing said circuit element with said decomposed geometry.

19. The method of claim 10, wherein said comparing uses a tolerance.

20. The method of claim 19, wherein said tolerance includes a parameter of said model or a value derived from a parameter of said model.

21. The method of claim 19, wherein said tolerance includes a tolerance region defined by:
decomposing said layout to obtain a decomposed geometry, said decomposed geometry being a point or a shape; and
associating said tolerance region to said decomposed geometry.

22. The method of claim 19, wherein said tolerance includes a tolerance surface, and said determining includes comparing said first description with said tolerance surface.

23. The method of claim 19, wherein said comparing comprises:
computing a difference between said description and said target description; and
comparing said difference with said tolerance.

24. The method of claim 19, wherein said tolerance is determined using an electrical description determined by:
identifying a circuit element with said layout; and
obtaining said electrical description from said circuit element.

25. The method of claim 24, wherein said identifying comprises:
decomposing said layout to obtain a decomposed geometry; and
recognizing said circuit element with said decomposed geometry.

26. The method of claim 10, wherein said description and said target description includes manufacturing and electrical specifications.

27. The method of claim 26, wherein said manufacturing and electrical specifications include one of the following: modulation transfer function, contrast, exposure latitude, image log slope, normalized image log slope, depth of focus, exposure-defocus window, total window, sensitivity to mask critical dimension error, sensitivity to aberrations, common window, linewidth variability, threshold voltage, leakage current, breakdown electric field, channel-length-modulation parameter, input and output impedance, input and output capacitance, input and output inductance, current density, current gain, unity current gain frequency, or any combination thereof.

28. A method for identifying weak spots in a target patterned layer of material in an integrated circuit including a plurality of patterned layers of material, comprising:

providing a layout of said target patterned layer;
providing a model that includes at least a first parametric representation characterizing at least features of the target patterned layer, and a second parametric representation characterizing at least features of the integrated circuit dependent on one of the plurality of patterned layers other than the target patterned layer;
providing a parameter of said model;
providing a first value and a second value of said parameter of said model;
computing a first description of a portion of said layout using said first value of said parameter, said first parametric representation, and said second parametric representation;
computing a second description of a portion of said layout using said second value of said parameter, said first parametric representation, and said second parametric representation; and
comparing said first description and said second description.

29. The method of claim 28, wherein said comparing uses a design rule defined by the manufacturing and electrical requirements of said integrated circuit.

30. A method for identifying weak spots in a target patterned layer of material in an integrated circuit including a plurality of patterned layers of material, comprising:

providing a layout of said target patterned layer;
providing a model that includes at least a first parametric representation characterizing at least features of the target patterned layer, and a second parametric representation characterizing at least features of the integrated circuit dependent on one of the plurality of patterned layers other than the target patterned layer;
providing a parameter of said model;
providing a first value and a second value of said parameter of said model;
computing a first description of a portion of said layout using said first value of said parameter, said first parametric representation, and said second parametric representation;
performing a first verification based on said first description and said target patterned layer, obtaining a first result;
computing a second description of a portion of said layout using said second value of said parameter, said first parametric representation, and said second parametric representation;
performing a second verification based on said second description and said target patterned layer, obtaining a second result; and
comparing said first result with said second result.

31. The method of claim 30, wherein said comparing uses a design rule defined by the manufacturing and electrical requirements of said integrated circuit.

32. A method for defining a physical connection in a target patterned layer of material in an integrated circuit including a plurality of patterned layers of material, comprising:

providing a layout of said target patterned layer;
providing a model that includes at least a first parametric representation characterizing at least features of the target patterned layer, and a second parametric representation characterizing at least features of the integrated circuit dependent on one of the plurality of patterned layers other than the target patterned layer;
providing a collection of placed cells with abstract interconnectivity information; and
defining said physical connection using said collection with said abstract interconnectivity information, said defining includes computing a description of a portion of said layout using said first parametric representation and said second parametric representation.

33. The method of claim 32, wherein said defining includes checking against a design rule defined by the manufacturing and electrical requirements of said integrated circuit.

34. A method for compacting a layout of a target patterned layer of material in an integrated circuit including a plurality of patterned layers of material, comprising:

providing a model that includes at least a first parametric representation characterizing at least features of the target patterned layer, and a second parametric representation characterizing at least features of the integrated circuit dependent on one of the plurality of patterned layers other than the target patterned layer; and
compacting said layout to obtain a compacted layout, said compacting includes computing a description of a portion of said compacted layout using said first parametric representation and said second parametric representation.

35. The method of claim 32, wherein said compacting includes checking against a design rule defined by the manufacturing and electrical requirements of said integrated circuit.

36. A method for layout synthesis of a layout of a target patterned layer of material in an integrated circuit including a plurality of patterned layers of material, comprising:

providing a model that includes at least a first parametric representation characterizing at least features of the target patterned layer, and a second parametric representation characterizing at least features of the integrated circuit dependent on one of the plurality of patterned layers other than the target patterned layer;
providing a netlist; and
computing a layout of said netlist, said computing includes computing a description of a portion of said layout using said first parametric representation and said second parametric representation.

37. The method of claim 36, wherein said computing includes checking against a design rule defined by the manufacturing and electrical requirements of said integrated circuit.

38. A method for generating a design rule used in the generation of a layout of a target patterned layer of material in an integrated circuit including a plurality of patterned layers of material, comprising:

providing a specification of said target patterned layer;

providing a model that includes at least a first parametric representation characterizing at least features of the target patterned layer, and a second parametric representation characterizing at least features of the integrated circuit dependent on one of the plurality of patterned layers other than the target patterned layer;

providing a parameter of said model; and generating a design rule using said model, said parameter, and said specification, said generating includes computing a description of a layout using said first parametric representation and said second parametric representation.

39. A method for generating a design rule used in the generation of a layout of a target patterned layer of material in an integrated circuit including a plurality of patterned layers of material, comprising:

providing a template of a design rule;

providing a specification of said template;

providing a model that includes at least a first parametric representation characterizing at least features of the target patterned layer, and a second parametric representation characterizing at least features of the integrated circuit dependent on one of the plurality of patterned layers other than the target patterned layer; and generating a design rule using said model and said specification, said generating includes computing a description of a layout using said first parametric representation and said second parametric representation.

40. A method for extracting an electrical parameter from a layout of a target patterned layer of material in an integrated circuit including a plurality of patterned layers of material, comprising:

providing a model that includes at least a first parametric representation characterizing features of the target patterned layer, and a second parametric representation characterizing features of one of the plurality of patterned layers other than the target patterned layer;

computing a description of a portion of said layout using said first parametric representation and said second parametric representation; and computing said electrical parameter using said description.

41. The method of claim 40, wherein said electrical parameter is one of the following: parasitic capacitance, parasitic inductance, or parasitic resistance.

42. A method for interactive layout editing of a layout of a target patterned layer of material in an integrated circuit including a plurality of patterned layers of material, comprising:

providing a model that includes at least a first parametric representation characterizing at least features of the target patterned layer, and a second parametric representation characterizing at least features of the integrated circuit dependent on one of the plurality of patterned layers other than the target patterned layer;

providing a shape of the layout being drawn;

computing a target description of a portion of said layout including said shape using said target patterned layer of material;

computing a description of a portion of said layout including said shape using said first parametric representation and said second parametric representation;

comparing said description with said target description; and supplying feedback on said comparing.

43. The method of claim 42, wherein said description is checked against a design rule defined by the manufacturing and electrical requirements of said integrated circuit.

44. The method of claim 42, wherein said feedback includes one of the following: a suggestion of vertex location, a region of allowable vertex locations, a list of suggestions, a score, a ranking, or any combination thereof.

45. The method of claim 42, wherein said feedback includes an explanation.

46. The method of claim 45, wherein said explanation includes one of the following: a reason for a suggested location, a reason for a discouraged location, a reason for a disallowed location, or any combination thereof.

47. A method for modifying a layout of a target patterned layer of material in an integrated circuit including a plurality of patterned layers of material, comprising:

providing a model that includes at least a first parametric representation characterizing features of the target patterned layer, and a second parametric representation characterizing features of one of the plurality of patterned layers other than the target patterned layer; and computing a modified layout from a portion of said layout using said model, said computing includes computing a description of a portion of said layout using said first parametric representation and said second parametric representation.

48. The method of claim 47, wherein said model is based on one of the following: physical theory, approximation, heuristics, or any combination thereof.

49. The method of claim 47, wherein at least one of said parametric representations is one of the following parametric representations: a lithography process, a mask-making process, an oxidation process, a deposition process, an etching process, an epitaxy process, an ion implantation process, a thermal process, a chemical-mechanical polishing process, a transistor, a capacitor, an inductor, or a resistor.

50. The method of claim 47, wherein said computing a modified layout includes: optical proximity correction, phase-shifting conversion, mask data preparation, dummy fill insertion, or a combination thereof.

51. The method of claim 47, wherein said description is an electrical description.

52. A method for disposing of an anomaly of a mask fabricated using a layout of a target patterned layer of material in an integrated circuit including a plurality of patterned layers of material, comprising:

providing a model that includes at least a first parametric representation characterizing at least features of the target patterned layer, and a second parametric representation characterizing at least features of the integrated circuit dependent on one of the plurality of patterned layers other than the target patterned layer;

extracting a portion of said layout corresponding to said mask anomaly;

computing a description of said portion of said layout using said first parametric representation and said second parametric representation; and evaluating whether to repair said mask anomaly based on said description.

53. The method of claim 52, wherein said evaluating includes checking against a design rule defined by the manufacturing and electrical requirements of said integrated circuit.

54. A method for manufacturing an integrated circuit including a plurality of patterned layers of material, said integrated circuit including at least one target patterned layer of material, comprising:
- obtaining a computer readable layout of a portion of said target patterned layer of material;
- providing a model that includes at least a first parametric representation characterizing at least features of the target patterned layer, and a second parametric representation characterizing at least features of the integrated circuit dependent on one of the plurality of patterned layers other than the target patterned layer;
- performing an operation on said layout to create an output layout using a data processor and using said model, said operation includes computing a description of a portion of said layout using said first parametric representation and said second parametric representation;
- producing mask data using said output layout;
- producing a mask having a mask layout pattern based on said mask data; and
- producing said target patterned layer of material using said mask.

55. The method of claim 54, wherein said operation includes one of the following: layout editing, layout synthesis, routing, compaction, layout verification, layout modification, or obtaining a layout description.

* * * * *